US006841803B2

(12) United States Patent
Aizawa et al.

(10) Patent No.: US 6,841,803 B2
(45) Date of Patent: Jan. 11, 2005

(54) DISPLAY DEVICE

(75) Inventors: Kaoru Aizawa, Ibaraki (JP); Masaya Adachi, Hitachi (JP); Shinichi Komura, Hitachi (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/321,546

(22) Filed: Dec. 18, 2002

(65) Prior Publication Data

US 2003/0127656 A1 Jul. 10, 2003

(30) Foreign Application Priority Data

Dec. 18, 2001 (JP) .................................... P2001-384413

(51) Int. Cl.$^7$ ......................... H01L 33/00; H01L 35/24; H01L 51/00
(52) U.S. Cl. ............................. 257/98; 257/40; 257/89
(58) Field of Search ............................ 257/79–103, 40; 349/115–119, 113, 114; 345/30, 37, 41; 313/567, 581, 585

(56) References Cited

U.S. PATENT DOCUMENTS

| 6,320,632 | B1 | * | 11/2001 | Nishimura | .................... | 349/97 |
| 6,417,903 | B1 | * | 7/2002 | Kaneko | ..................... | 349/117 |
| 6,580,482 | B1 | * | 6/2003 | Hiji et al. | .................... | 349/115 |
| 2001/0022997 | A1 | * | 9/2001 | Honda et al. | .............. | 428/1.31 |
| 2001/0026335 | A1 | * | 10/2001 | Moon | .......................... | 349/63 |
| 2002/0021392 | A1 | * | 2/2002 | Ohtake et al. | .............. | 349/115 |
| 2002/0041348 | A1 | * | 4/2002 | Yokoyama et al. | ........... | 349/61 |
| 2002/0093284 | A1 | * | 7/2002 | Adachi et al. | .............. | 313/506 |

FOREIGN PATENT DOCUMENTS

| JP | 8-509834 A | 10/1996 |
| JP | 9-127885 A | 5/1997 |
| JP | 2001-215886 A | 8/2001 |
| WO | WO 94/15442 A1 | 7/1994 |
| WO | WO 95/27919 A2 | 10/1995 |

OTHER PUBLICATIONS

The Institute of Image Information and Television Engineers Journal. "History And Perspective of Organic Electroluminescence Display (OLED)" vol. 54, No. 8 pp. 1115–1120.

Satoshi Miyauchi et al. Journal of the SID "Organic LED Full–Color Passive–Matrix Display" pp. 221–226 Jul. 3, 1999.

T. Shimoda SID 99 Digest "Multicolor Pixel Patterning of Light–Emitting Polymers by Ink–Jet Printing" pp. 376–379 1999.

M.F Weber SID 92 Digest "Retroreflecting Sheet Polarizer" pp. 427–429 1992.

* cited by examiner

*Primary Examiner*—Shouxiang Hu
(74) *Attorney, Agent, or Firm*—Sughrue Mion, PLLC

(57) ABSTRACT

A display device having: a light-emitting layer 100; a light-reflecting member disposed on a back surface of the light-emitting layer; a polarized light separating unit 500 provided so that light in a predetermined wavelength range corresponding to light emitted from the light-emitting layer is separated into two kinds of polarized light components by reflection and transmission; a polarizer 600; and a retarder 700, the polarized light separating unit 500, the polarizer 600 and the retarder 700 being disposed on a front surface side of the light-emitting layer.

11 Claims, 15 Drawing Sheets

DISPLAY DEVICE

The present invention is based on Japanese Patent Application No. 2001-384413, which is incorporated herein by reference.

BACKGROUND OF THE INVENTION

1. Field of the Invention

The present invention relates to a display device for performing display by controlling light-emitting operations of light-emitting elements, and particularly to a display device having light-emitting elements such as organic light-emitting diodes each having a light-reflecting surface on a back surface of a light-emitting layer.

2. Related Art

An organic light-emitting diode is a device for emitting light in such a manner that positive or negative electric charge is injected into a light-emitting layer of an organic thin film to thereby convert electric energy into light energy.

A display device constituted by organic light-emitting diodes (hereinafter referred to as "OLED display") is of a self-luminous type to be different from a non-luminous type display device represented by a liquid-crystal display device. Hence, the OLED display is flat and lightweight because it is unnecessary to provide any auxiliary light source such as a backlight. In addition, the OLED display has a feature in that the OLED display is wide in viewing angle and rapid in response speed of display.

FIG. 19 is a partly schematic sectional view showing an example of the OLED display according to the related art. The OLED display is formed in such a structure that a transparent electrode 200 functioning as an anode, a hole transport layer 102, a light-emitting layer 100, an electron transport layer 101 and a, reflection electrode 300 of a light-reflecting metal functioning as a cathode are laminated successively on a transparent substrate 400.

When a DC voltage is applied between the transparent electrode 200 and the reflection electrode 300, holes injected from the transparent electrode 200 reach the light-emitting layer 100 via the hole transport layer 102 while electrons injected from the reflection electrode 300 reach the light-emitting layer 100 via the electron transport layer 101. The electrons are recombined with the holes to thereby emit light at a predetermined wavelength from the light-emitting layer 100.

Of the light emitted from the light-emitting layer 100, light traveling toward the transparent electrode 200 passes through the transparent electrode 200 and emerges from the transparent substrate 400. In addition, light traveling toward the reflection electrode 300 is reflected by the reflection electrode 300, passes through the light-emitting layer 100, the transparent electrode 200, etc. and also emerges from the transparent substrate 400.

Hence, to obtain a bright image in such an OLED display, it is important that a high reflectance electrode is used as the reflection electrode for increasing the amount of light emerging from the transparent electrode side.

Incidentally, in the structure, the reflection electrode serves as a high reflectance mirror when light has been not emitted yet. Hence, when the OLED display is used under a bright environment, there is a problem that image quality deteriorates because of reflection of a surrounding scene in the mirror, or there is a problem that the contrast ratio is lowered because of spoilage of black display by reflection of external light. As a measure to solve this problem, a structure in which a circularly polarizing plate 800 is disposed on the light-emergence surface side of the transparent substrate 400 has been put into practical use. The circularly polarizing plate 800 contains a polarizer 600, and a retarder 700 functioning as a quarter-wave plate.

The circularly polarizing plate 800 operates as follows. External light 2000 incident onto the OLED display from the environment is generally non-polarized light. When the external light 2000 passes through the polarizer 600, linearly polarized light having a plane of polarization in a specific direction is transmitted through the polarizer 600 but linearly polarized light having a plane of polarization perpendicular to the specific direction is absorbed to the polarizer 600. The linearly polarized light transmitted through the polarizer 600 is converted into circularly polarized light having a rotating plane of polarization (e.g., right-hand circularly polarized light) by the action of the retarder 700.

When the light passing through the retarder 700 is reflected by the reflection electrode 300, the phase of the light shifts by n to so that the light is converted into circularly polarized light rotating in the reverse direction (e.g., left-hand circularly polarized light). The light 2000R reflected by the reflection electrode 300 is made incident onto the retarder 700 again. When the light 2000R passes through the retarder 700, the light 2000R is converted into linearly polarized light by the action of the retarder 700. In this case, the linearly polarized light is absorbed to the polarizer 600, so that the light does not return back to the outside of the display device. That is, reflection of external light by the reflection electrode 300 is suppressed so that black display becomes darker. Hence, the contrast ratio is improved greatly.

Such a structure has been disclosed in Japanese Patent Publication No. JP-T-08-509834, Japanese Patent Publication No. JP-A-09-127885, etc.

Several methods for providing the OLED display as a full color display have been proposed and demonstrated. For example, there have been proposed a method using fluorescent color changing mediums (CCMs) in combination with blue light-emitting elements (hereinafter referred to as "CCM method"), a method using color filters of the three primary colors of red (R), green (G) and blue (B) in combination with white light emission (hereinafter referred to as "RGB-by-white method"), a method of directly applying pixels constituted by light-emitting elements of the three primary colors (R, G and B) in accordance with colors (hereinafter referred to as "RGB side-by-side arrangement method"), and so on.

In the CCM method, light emission of the three primary colors is obtained in such a manner that a fluorescence dye layer for changing fluorescent color is excited by light emitted from a blue light-emitting layer to thereby convert blue into green and red. In this method, device efficiency is lowered if color changing efficiency is low. In addition, under a bright environment, the color changing mediums are excited to be brighter by external light, so that black display is spoiled. Hence, the contrast ratio is lowered.

In the RGB-by-white method, light-emitting layers to be produced are of only a white type. This method has an advantage that the light-emitting layers can be produced most easily. There is however a problem that efficiency in utilization of light is lowered because light is absorbed to color filters.

In the RGB side-by-side arrangement method, it is necessary to produce three kinds of devices on one substrate.

Hence, although the production process is somewhat complex, it is however said that this method is an ideal method in terms of efficiency because light loss is smallest. With respect to application (patterning) of RGB by colors, when a so-called low-molecular material such as a fluorescence dye or a metal complex low in molecular weight is used, a technique for applying RGB finely in accordance with colors by vacuum deposition of an organic layer using a shadow mask has been proposed.

As another method, a method using a polymer-based material such as a n-conjugated polymer or a dye-containing polymer containing a highly polymerized dye has been proposed. In this case, there has been proposed a technique in which RGB is provided so as to be finely patterned with an organic material in accordance with colors by printing in an ink-jet manner while banks of polyimide or the like are formed by photo-etching to thereby separate pixel regions from one another (The Institute of Image Information and Television Engineers Journal Vol. 54, No. 8, pp. 1115–1120).

Another example of the self-luminous type display device other than the OLED display is a plasma display. In the plasma display, each fluorescent substance is excited by ultraviolet rays generated by plasma discharge in a discharge cell to thereby obtain visible light with a predetermined color. That is, each fluorescent substance in the discharge cell functions as a light-emitting layer.

Generally, the fluorescent substance exhibits white under visible light and has characteristic of scatter reflection. Hence, external light incident onto the discharge cell is reflected by the fluorescent substance. Hence, under a bright environment, black display is spoiled by reflection of external light, so that the contrast ratio is lowered. As a measure to solve this problem, a plasma display panel having a reflective polarizer (reflective polarizing film) and an absorptive polarizer (absorptive polarizing film) at its front side has been disclosed in Japanese Patent Publication No. JP-A-2001-215886.

Since a half part of external light incident onto the plasma display panel from the environment is absorbed to the absorptive polarizer in this case, reflection of external light is reduced to be not larger than a halt. On the other hand, a half part of light emitted from the fluorescent substance is first transmitted through the reflective polarizer and the absorptive polarizer to contribute to display but the other half part of the light is reflected by the reflective polarizer. After the light reflected by the reflective polarizer is further reflected in the discharge cell, a half part of the reflected light is transmitted through the reflective polarizer and the absorptive polarizer to contribute to display but the other half part of the reflected light is reflected by the reflective polarizer again.

The aforementioned operation is repeated by many times. Finally, since almost all the light emitted from the fluorescent substance is not absorbed to but transmitted through the absorptive polarizer to contribute to-display, not only can lowering of luminance be suppressed by the disposition of the absorptive polarizer but also the contrast ratio under external light can be improved.

In the plasma display having a reflective polarizer and an absorptive polarizer at its front side, a half part of the external light incident onto the plasma display from the environment is absorbed to the absorptive polarizer but the other half part of the light transmitted through the absorptive polarizer is reflected in the discharge cell and then transmitted through the absorptive polarizer so that the resulting light goes out of the plasma display. Hence, reflection of external light cannot be suppressed perfectly.

On the other hand, a half part of light emitted from the fluorescent substance is first transmitted through the reflective polarizer and the absorptive polarizer to contribute to display but the other half part of the light is reflected by the reflective polarizer. The light reflected by the reflective polarizer is further reflected in the discharge cell and then goes toward the reflective polarizer again. On this occasion, the fluorescent substance which serves as a light-emitting layer generally does not retain but eliminates the state of polarization of light transmitted through the fluorescent substance or of light reflected. For this reason, the light reflected in the discharge cell becomes non-polarized light, so that a half part of the reflected light is transmitted through the reflective polarizer and the absorptive polarizer to contribute to display but the other half part of the reflected light is reflected by the reflective polarizer again.

In this manner, light emitted from the fluorescent substance contributes to display without being absorbed to the absorptive polarizer while reflection of the light is repeated between the reflective polarizer and the discharge cell.

Since reflectance of the discharge cell is not 100%, a part of the light is absorbed as a light loss whenever reflection of light is repeated between the reflective polarizer and the discharge cell. For this reason, all the light emitted from the fluorescent substance cannot contribute to display actually, and about 40% of light is cut off as a light loss.

On the other hand, in the OLED display having a circularly polarizing plate, reflection of external light by the reflection electrode can be reduced by the action of the circularly polarizing plate. Hence, a high contrast ratio can be achieved even under a bright environment.

Display however becomes darker because a part of light emitted from the light-emitting layer is absorbed to the circularly polarizing plate. This is because light emitted from the light-emitting layer is generally non-polarized light so that at least a half part of light is absorbed to a polarizer which is one of constituent members of-the circularly polarizing plate.

When a full color display device is achieved by organic light-emitting diodes, the RGB side-by-side arrangement method is used most preferably from the point of view of device efficiency. In the existing organic light-emitting diodes, however, it cannot be said that color purity is sufficient because the wavelength distributions of emitted light are broad and gentle in accordance with the colors.

SUMMARY OF THE INVENTION

In consideration of the above description, an object of the invention is to provide a display device in which light emitted from a light-emitting layer is made to contribute to display efficiently to thereby achieve bright display and in which reflection of external light is reduced to thereby achieve high-contrast-ratio display even under a bright environment.

Another object of the invention is to provide a display device in which high-color-purity display can be performed without spoiling of brightness.

The gist of the invention to achieve the foregoing objects is as follows. A display device has a light-emitting element constituting a plurality of pixels arranged in the form or a matrix, wherein: the light-emitting element includes a light-emitting layer, and a light-reflecting surface disposed on a back surface of the light-emitting layer; and the display device further has a polarized light separating unit for separating light emitted from the light-emitting layer into two kinds of polarized light components by reflection and transmission, a retarder and a polarizer, the polarized light separating unit, the retarder and the polarizer being provided on a front surface side of the light-emitting layer. The light-emitting layer is provided for substantially retaining the state of polarization of light transmitted through the light-emitting layer. The light-reflecting surface is a reflecting surface provided for reflecting at least perpendicularly incident circularly polarized light rotating in one direction to thereby make the circularly polarized light rotate in the reverse direction to the one direction.

Preferably, the polarized light separating unit is constituted by a laminate of polarized light separating layers through which light in a wavelength range corresponding to light emitted from the light-emitting layer is separated into two kinds of polarized light components by reflection and transmission, the polarized light separating layers being laminated in accordance with the number of colors contained in the light emitted from the light-emitting layer.

For example, a laminate of cholesteric liquid-crystal layers may be used as the polarized light separating unit. In this case, cholesteric liquid-crystal layers formed so that the wavelength range of selective reflection by each cholesteric liquid-crystal layer is equal to or narrower than the wavelength range of light emitted from a specific light-emitting layer are laminated in accordance with the number of colors of light emitted from the light-emitting layer. That is, cholesteric liquid-crystal layers having different wavelength ranges of selective reflection in accordance with the number of colors of light emitted from the light-emitting layer are laminated in accordance with the number of colors of light emitted from the light-emitting layer. A quarter-wave plate is used as the retarder.

In this structure, light emitted from the light-emitting layer is made incident onto each of the cholesteric liquid-crystal layers constituting the polarized light separating unit, directly or after reflected by the light-reflecting surface disposed on the back surface of the light-emitting layer. Of the light incident onto each of the cholesteric liquid-crystal layers, a circularly polarized light component rotating in one direction (e.g., left-hand circularly polarized light component) is reflected by the cholesteric liquid-crystal layer having a wavelength range of selective reflection in accordance with the wavelength range of emitted light but the other circularly polarized light component rotating in the reverse direction to the one direction (e.g., right-hand circularly polarized light component) is transmitted through the cholesteric liquid-crystal layer.

The light transmitted through the cholesteric liquid-crystal layers is converted from circularly polarized light into linearly polarized light by the action of the retarder. The linearly polarized light is not absorbed to but transmitted through the polarizer and goes toward the observer.

On the other hand, the light reflected by a corresponding one of the cholesteric liquid-crystal layers is transmitted through the light-emitting layer while the state of polarization is substantially retained. The light is reflected by the light-reflecting surface and goes toward the cholesteric liquid-crystal layers again. When the light is reflected by the light-reflecting surface, the phase of the light shifts by into thereby make the circularly polarized light rotate in the reverse direction (e.g., right-hand circularly polarized light). For this reason, at this time, the light is transmitted through the cholesteric liquid-crystal layers and converted into linearly polarized light by the action of the retarder so that the linearly polarized light can be transmitted through the polarizer. Then, the light is transmitted through the polarizer and goes toward the observer.

That is, wasteful light absorbed to the polarizer in the related art can be reused because the light is reflected by the polarized light separating unit (cholesteric liquid-crystal layers) before absorbed to the polarizer. Hence, display can be made brighter.

On this occasion, light emitted from the light-emitting layer and reflected by the polarized light separating unit (cholesteric liquid-crystal layers) is reflected by the light-reflecting surface once and then transmitted through the polarized light separating unit and the polarizer to thereby contribute to display.

That is, since light reflected by the polarized light separating unit is reflected by the light-reflecting surface only once, reflection loss can be minimized. Hence, light can be reused very efficiently, so that brighter display can be obtained.

Moreover, when the wavelength range of light reflected by the polarized light separating unit (each cholesteric liquid-crystal layer) to be reused is selected to be narrower than the wavelength range of light emitted from the light-emitting layer, the wavelength distribution of light actually emitted from the display device can be made more precipitous than the wavelength distribution of light emitted from the light-emitting layer. Hence, light higher in color purity than light itself emitted from the light-emitting layer can be obtained.

On the other hand, since external light incident onto the display device from the surroundings under a bright environment is generally non-polarized light, at least a half part of the external light is absorbed to the polarizer when the external light passes through the polarizer. When the light is transmitted through the retarder, the light which has passed through the polarizer is converted into-circularly polarized light (e.g., right-hand circularly polarized light) by the action of the retarder. The circularly polarized light is transmitted through the cholesteric liquid-crystal layers.

The light transmitted through the cholesteric liquid-crystal layers is transmitted through the light-emitting layer while the state of polarization of the light is substantially retained. When the light is reflected by the light-reflecting surface, the light is converted into circularly polarized light rotating in the reverse direction (e.g., left-hand circularly polarized light). The circularly polarized light is made incident onto the cholesteric liquid-crystal layers again. Of the light incident onto the cholesteric liquid-crystal layers, light at a wavelength out of the wavelength range of selective reflection by each cholesteric liquid-crystal layer is directly transmitted through the cholesteric liquid-crystal layers and converted into linearly polarized light by the action of the retarder. The linearly polarized light is absorbed to the polarizer so as not to go out of the display device.

On the other hand, light which is a part of the light incident onto the cholesteric liquid-crystal layers and which is in the wavelength range of selective reflection by a corresponding one of the cholesteric liquid-crystal layers is reflected by the cholesteric liquid-crystal layer and further reflected by the light-reflecting surface again. Then, the light passes through the cholesteric liquid-crystal layers, the retarder and the polarizer and emerges from the display device. Because the amount of the emergent light is slight, black (dark) display becomes darker even under a bright environment, so that a high contrast ratio can be achieved.

Incidentally, the main wavelength ranges of selective reflection by the cholesteric liquid-crystal layers constituting the polarized light separating unit may be preferably selected so as not to overlap one another. Hence, the amount of light at wavelengths in the visible region excluding the wavelength range of selective reflection by each cholesteric liquid-crystal layer increases, so that the following effect can be obtained.

That is, of the external light incident onto the display device, light transmitted through the polarizer is transmitted through the retarder, the cholesteric liquid-crystal layers, etc. and reflected by the light-reflecting surface so as to be incident onto the cholesteric liquid-crystal layers again. Of the light incident onto the cholesteric liquid-crystal layers again, light at wavelengths out of the wavelength range of selective selection by each cholesteric liquid-crystal layer is directly transmitted through the cholesteric liquid-crystal layers and absorbed to the polarizer.

The amount of the light absorbed to the polarizer increases as the amount of light at wavelengths in the visible region excluding the wavelength range of selective reflection by the polarized light separating unit (cholesteric liquid-crystal layers) increases. As a result, reflection of external light is reduced, so that a higher contrast ratio can be achieved even under a bright environment.

Moreover, in the invention, color filters each capable of transmitting light in a main wavelength range emitted from the light-emitting layer but absorbing light at wavelengths in the visible region excluding the main wavelength range may be disposed when a higher contrast ratio is required under a bright environment.

In this case, external light incident onto the display device is transmitted through the polarizer, the retarder, the cholesteric liquid-crystal layers, etc. and reflected by the light-reflecting surface so as to be incident onto the cholesteric liquid-crystal layers. Of the light incident onto the cholesteric liquid-crystal layers, light at wavelengths equivalent to the wavelength range of selective reflection by a corresponding one of the cholesteric liquid-crystal layers is reflected by the cholesteric liquid-crystal layer and further reflected by the light-reflecting surface again. At this time, the light is transmitted through the cholesteric liquid-crystal layers, the retarder and the polarizer and goes out of the display device.

The amount of the light going out of the display device is slight because the light passes through the color filter unit a plurality of times in such a manner that light at wavelengths in the visible region excluding the wavelength range of emitted light is absorbed whenever the light passes through the color filter unit. Hence, black display becomes darker even under a bright environment, so that a higher contrast ratio can be achieved.

DETAILED DESCRIPTION OF THE PREFERRED EMBODIMENTS

Figure 1:
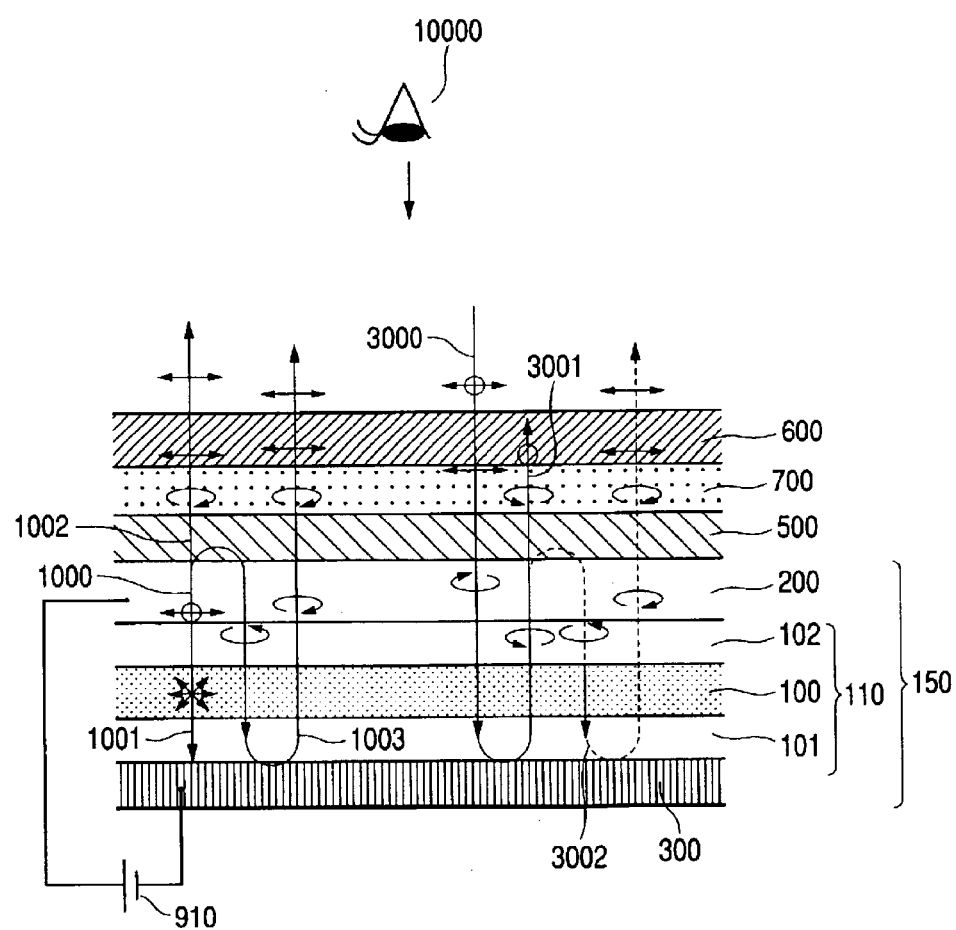
FIG. 1 is a partly schematic sectional view showing a display device according to an embodiment of the invention.
Figure 2:
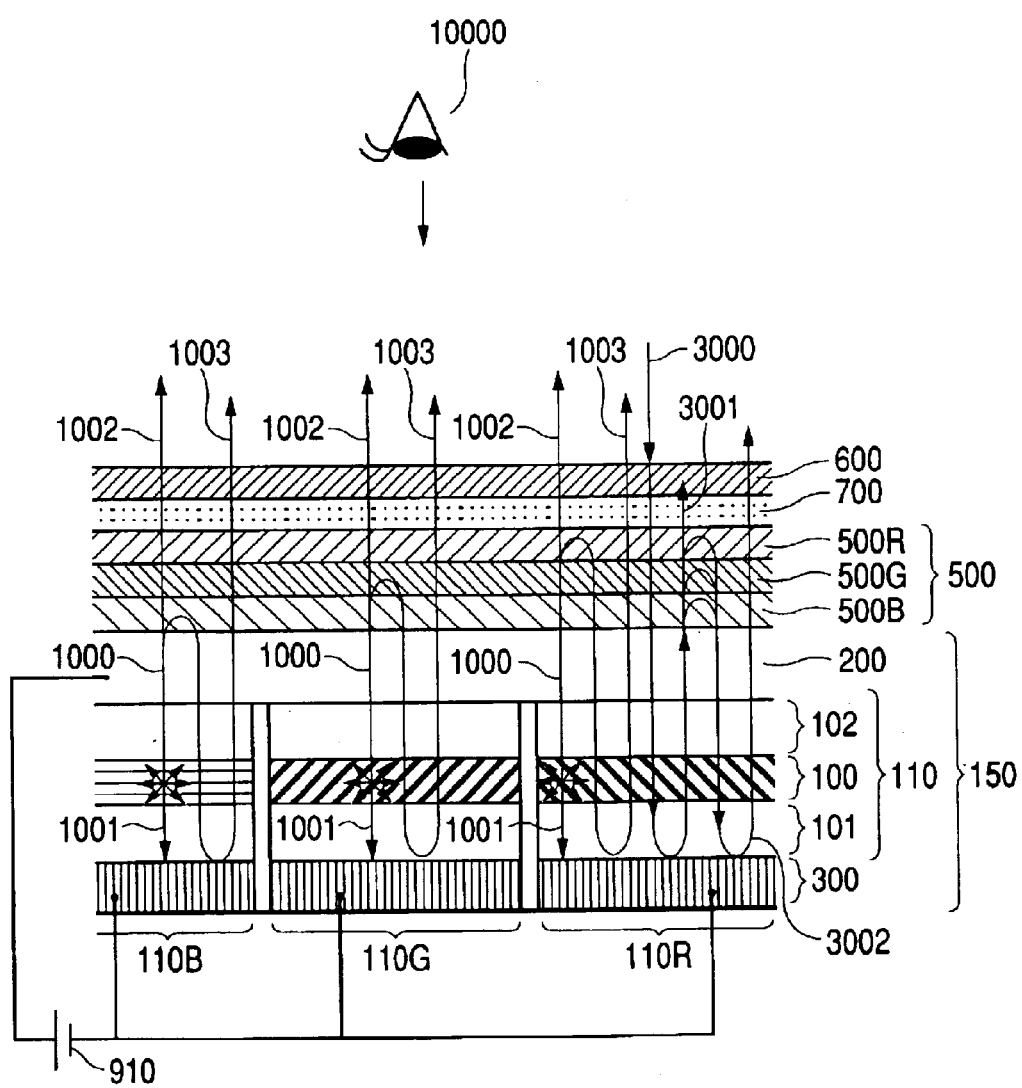
FIG. 2 is a partly schematic sectional view showing a display device according to an embodiment of the invention.

Embodiments of the invention will be described below with reference to the drawings. FIGS. 1 and 2 are partly schematic sectional views for explaining the basic configuration and operating principle of a display device according to the invention.

A light-emitting element in the display device according to the invention includes an organic light-emitting diode section 150 formed on a substrate not shown, a polarized light separating unit 500, a retarder 700, and a polarizer 600. The organic light-emitting diode section 150 has a transparent electrode 200 functioning as an anode, a reflection electrode 300 functioning as a cathode and as a light-reflecting mirror surface, and an organic layer 110 formed between the anode and the cathode. The polarized light separating unit 500, the retarder 700 and the polarizer 600 are disposed successively on the front surface side (transparent electrode 200 side) of the organic light-emitting diode section 150.

A laminate disposed between the anode (transparent electrode 200) and the cathode (reflection electrode 300) in such a manner that an electron transport layer 101, a light-emitting layer 100 and a hole transport layer 102 are laminated successively on the cathode (reflection electrode 300) side can be used as the organic layer 110 in the organic light-emitting diode section 150.

Incidentally, the light-emitting layer 100 and the electron transport layer 101 may be made of a material so that a layer of the material can serve as both the light-emitting layer 100 and the electron transport layer 101. As the structure of the organic light-emitting diode section 150, an anode buffer layer may be additionally disposed between the anode (transparent electrode 200) and the hole transport layer 102. The anode buffer layer may be made of CuPc. It is conceived that CuPc performs the role of improving contact between the anode and the hole transport layer.

The anode (transparent electrode 200) may be made of a transparent electrode material high in work function. For example, ITO (Indium Tin Oxide) is preferably used as the material. Alternatively, InZnO may be used as the material.

The reflection electrode 300 which is the cathode may be made of a material low in work function, such as Al, Mg, Mg—Ag alloy, or Al—Li alloy. When Al is used singly, a high drive voltage is required so that the life of the reflection electrode 300 is shortened. Therefore, a very thin layer of an Li compound (such as lithium oxide $Li_2O$, or lithium fluoride LiF) may be inserted between the reflection electrode 300 and the organic layer 110 to thereby obtain characteristic equivalent to that of an Al—Li alloy.

A portion of the organic layer being in contact with the cathode may be doped with a high reactive metal such as lithium or strontium to thereby make the drive voltage low. Incidentally, the reflection electrode 300 is preferably made of a high reflectance material from the point of view of improvement in efficiency of utilization of light emitted from the light-emitting layer. For the reason which will be described later, it is further preferable, from the point of view of reduction in reflection of external light and improvement in efficiency of utilization of light emitted from the light-emitting layer, that the reflection electrode 300 has a mirror surface for reflecting at least perpendicularly incident circularly polarized light to thereby make the circularly polarized light rotate in the reverse direction.

The organic layer 110 is made of a material which emits light with a desired color when a predetermined voltage is applied between the anode (transparent electrode 200) and the cathode (reflection electrode 300).

The material of the organic layer 110 used for emitting red light may be prepared as follows. For example, the hole transport layer 102 can be made of α-NPD (N,N'-di(α-naphthyl)-N,N'-diphenyl-1,1'-biphenyl-4,4'-diamine) or triphenyldiamine derivative TPD (N,N'-bis(3-methylphenyl)-1,1'-biphenyl-4,4'-diamine). The electron transport light-emitting layer (which serves as both the electron transport layer 101 and the light-emitting layer 100) can be made of Alq3 (tris(8-quinolinolate)aluminum) containing DCM-1 (4-(dicyanomethylene)-2-methyl-6-(p-dimethylaminostyryl)-4H-pyran) dispersed in the Alq3.

The material of the organic layer 110 used for emitting green light may be prepared as follows. For example, the hole transport layer 102 can be made of α-NPD or triphenyldiamine derivative TPD. The electron transport light-emitting layer (which serves as both the electron transport layer 101 and the light-emitting layer 100) can be made of Alq3, Bebq or Alq3 doped with quinacridone.

The material of the organic layer 110 used for emitting blue light may be prepared as follows. For example, the hole transport layer 102 can be made of α-NPD or triphenyldiamine derivative TPD. The light-emitting layer 100 can be made of DPVBi (4,4'-bis(2,2'-diphenylvinyl)biphenyl), a mixture material of DPVBi and BCzVBi (4,4'-bis(2-carbazolevinylene)biphenyl) or a doped material containing a distyrylallylene derivative as a host and a diethylamine derivative as a guest. The electron transport layer 102 can be made of Alq3.

Alternatively, Zn(oxz)-2 (2-(o-hydroxyphenyl)-benzoxazole zinc complex) may be used as the material of the electron transport light-emitting layer (which serves as both the electron transport layer 101 and the light-emitting layer 100).

A polymer-based material may be used in place of the low molecular material. As an example of the polymer-based material, a laminated film of PEDT/PSS (a mixture layer of polyethylene dioxy thiophene and polystyrene sulfonate) and PPV (poly(p-phenylene vinylene) may be used as the hole transport layer 102 and the light-emitting layer 100.

Emission of green light can be achieved by a mixture of PPV and green ink. Emission of red light can be achieved by a mixture of green ink and rhodamine 101 added as a red light-emitting dopant. F8 (poly(dioctylfluorene)) may be used as a blue light-emitting layer. Incidentally, F8 functions also as the electron transport layer 101.

In addition, a dye-containing polymer such as PVK (polyvinyl carbazole) may be used as another polymer-based material.

In any case, each of layers constituting the organic layer 110 is as thin as tens of nm, so that the state of polarization of light transmitted through the layer is substantially retained.

In the organic light-emitting diode section 150 configured as described above, a DC power supply 910 is connected-between the transparent electrode 200 as an anode and the reflection electrode 300 as a cathode. When a DC voltage is applied between the transparent electrode 200 and the reflection electrode 300, holes injected from the transparent electrode 200 and electrons injected from the reflection electrode 300 reach the light-emitting layer 100 through the hole transport layer 102 and the electron transport layer 101, respectively. The electrons are recombined with the holes, so that light at a predetermined wavelength is emitted from the light-emitting layer 100.

A polarized light separating unit 500, a retarder 700 and a polarizer 600 are laminated and disposed successively on a surface of the transparent electrode 200 opposite to the organic layer 110.

The polarized light separating unit 500 has a function for separating light in a predetermined wavelength range into two kinds of polarized light components by reflection and transmission. A cholesteric liquid-crystal layer is preferably used as the polarized light separating unit 500.

The cholesteric liquid-crystal layer exhibits unique optical characteristic based on its helical molecular arrangement. Light incident onto the cholesteric liquid-crystal layer so as to be parallel with the helical axis is selectively reflected in accordance with the direction of rotation of the cholesteric helix at a wavelength corresponding to the pitch of the cholesteric helix so that one circularly polarized light component rotating in one direction is reflected but the other circularly polarized light component is transmitted.

The central wavelength $\lambda_0$ of selective reflection by the cholesteric liquid-crystal layer and the wavelength band $\Delta\lambda$ thereof are given by the equations (1) and (2) respectively:

$$\lambda_0 = n_m \cdot p \qquad (1)$$

$$\Delta\lambda = \Delta n \cdot p \qquad (2)$$

in which p is the helical pitch of the cholesteric liquid-crystal layer, $n_m$ is the average refractive index of the liquid crystal, and $\Delta n$ is the birefringence of the liquid crystal. When $n_e$ and $n_O$ are a refractive index in a direction parallel with the major axis of the liquid crystal molecules and a refractive index in a direction perpendicular to the major axis of the liquid crystal molecules respectively, $n_m$ and $\Delta n$ are given by the equations (3) and (4) respectively.

$$n_m = \sqrt{((n_e^2 + n_o^2)/2)} \qquad (3)$$

$$\Delta n = n_e - n_o \qquad (4)$$

When, for example, a display device for performing full color display is to be produced, the wavelength of light emitted from the organic light-emitting diode section maybe preferably selected in accordance with the three primary colors of red, green and blue for each pixel.

That is, as shown briefly in FIG. 2, the organic layer 110 is divided into a red light-emitting organic layer 110R, a green light-emitting organic layer 110G and a blue light-emitting organic layer 110B in accordance with-the three primary colors so that the peak wavelength of light emitted from the organic light-emitting diode section 150 varies in accordance with each pixel.

On the other hand, the wavelength range of selective reflection by the cholesteric liquid-crystal layer or the central wavelength $\lambda_0$ of the selective reflection is selected in accordance with the wavelength range of light emitted from the organic light-emitting diode section 150 or the peak wavelength of the light. When, for example, the color of light emitted from the organic light-emitting diode section 150 is constituted by the three primary colors of red (R), green (G) and blue (S), the polarized light separating unit 500 is constituted by a laminate of three cholesteric liquid-crystal layers 500R, 500G and 500B having wavelength ranges of selective reflection of red, green and blue respectively.

Figure 3:
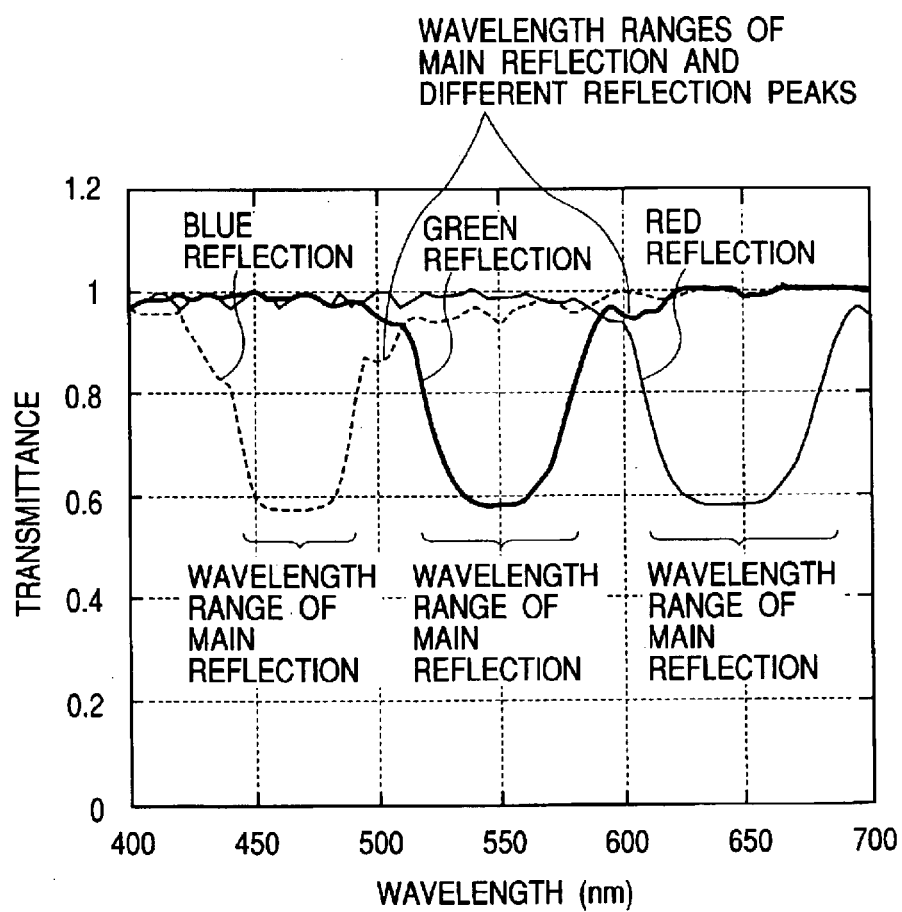
FIG. 3 is a graph showing an example of wavelength dependence of transmittance of cholesteric liquid-crystal layers in the display device according to the invention.

FIG. 3 is a graph showing wavelength dependence of transmittance in the case where non-polarized light is incident onto the cholesteric liquid-crystal layers. FIG. 3 shows an example of transmittance of the cholesteric liquid-crystal layers which exhibit selective reflection in accordance with the three primary colors of red, green and blue respectively.

When the color of light emitted from the organic light-emitting diode section 150 is divided in the three primary colors of red, green and blue; a cholesteric liquid-crystal layer 500R exhibiting red reflecting characteristic, a cholesteric liquid-crystal layer 500G exhibiting green reflecting characteristic and a cholesteric liquid-crystal layer 500B exhibiting blue reflecting characteristic as shown in FIG. 3 may be laminated and disposed to thereby form the polarized light separating unit 500.

That is, a laminate of cholesteric liquid-crystal layers having wavelength ranges of selective reflection in accordance with the colors of light emitted from the organic light-emitting diode section 150 may be used as the polarized light separating unit 500.

The retarder 700 and the polarizer 600 constitute a so-called circularly polarizing plate in the related art. That is, of light which has passed through the polarizer 600, the polarizer 600 transmits linearly polarized light having a plane of polarization in a specific direction but absorbs linearly polarized light having a plane of polarization in a direction perpendicular to the specific direction. The retarder 700 functions as a quarter-wave plate by which the linearly polarized light transmitted through the polarizer 600 is converted into circularly polarized light having a rotating plane of polarization.

A stretched film of polyvinyl alcohol which has a polarizing function given by iodine absorbed to the polyvinyl alcohol and which has opposite surfaces coated with protective layers of triacetyl cellulose can be used as the polarizer 600.

A transparent uniaxially stretched high-molecular film such as a polyvinyl alcohol film, a polycarbonate film, a polysulfone film, a polystyrene film or a polyallylate film can be used as the retarder 700. Incidentally, because a high-molecular film constituting the retarder generally exhibits wavelength dependence of refractive index, sufficient performance cannot be obtained for light in a wide wavelength range, e.g., external light such as sunlight or illumination light, if one kind of retarder is used. Therefore, two kinds of retardation films different in wavelength dependence of refractive index may be stuck to each other with their optical axes displaced from each other to thereby form a retarder functioning as a quarter-wave plate in a wide wavelength range.

Incidentally, it is important that the direction of the slow axis of the retarder 700 is decided so that light which has passed through the polarizer 600 and the retarder 700 is circularly polarized light (e.g., right-hand circularly polarized light) rotating in one direction reverse to that of the circularly polarized light (e.g., left-hand circularly polarized light) selectively reflected by each of the cholesteric liquid-crystal layers constituting the polarized light separating unit 500.

The operation of the display device will be described below with reference to FIGS. 1 and 2. When a DC power supply 910 is connected between the transparent electrode 200 and the reflection electrode 300 and a current is made to flow therebetween, light at a predetermined wavelength is emitted from the light-emitting layer 100.

Of the light emitted from the light-emitting layer 100, light 1000 going outward the transparent electrode 200 side is directly transmitted through the transparent electrode 200 so as to be incident onto the polarized light separating unit 500. On the other hand, of the light emitted from the light-emitting layer 100, light 1001 going toward the reflection electrode 300 side is reflected by the reflection electrode 300 and then also transmitted through the transparent electrode 200 so as Lo be incident onto the polarized light separating unit 500.

On this occasion, light emitted from the light-emitting layer 100 is non-polarized light. Hence, of the light incident onto the polarized light separating unit 500, one circularly polarized light component rotating in one direction (e.g., left-hand circularly polarized light component) is reflected in a corresponding cholesteric liquid-crystal layer having a wavelength range of selective reflection corresponding to the wavelength range of the emitted light but the other circularly polarized light component rotating in the reverse direction to the one direction (e.g., right-hand circularly polarized light component) is transmitted through the cholesteric liquid-crystal layer.

That is, one circularly polarized light component of red rotating in one direction (e.g., left-hand circularly polarized light component) is reflected in the cholesteric liquid-crystal layer 500R exhibiting a wavelength range of selective reflection corresponding to red but the other circularly polarized light component is transmitted through the cholesteric liquid-crystal layer 500R. Similarly, one circularly polarized light component of green rotating in one direction (e.g., left-hand circularly polarized light component) is reflected in the cholesteric liquid-crystal layer 500G exhibiting a wavelength range of selective reflection corresponding to green but the other circularly polarized light component is transmitted through the cholesteric liquid-crystal layer 500G. Similarly, one circularly polarized light component of blue rotating in one direction (e.g., left-hand circularly polarized light component) is reflected in the cholesteric liquid-crystal layer 500B exhibiting a wavelength range of selective reflection corresponding to blue but the other circularly polarized light component is transmitted through the cholesteric liquid-crystal layer 500B.

Light 1002 transmitted through the polarized light separating unit 500 is converted into linearly polarized light by the action of the retarder 700 so that the linearly polarized light can be transmitted through the polarizer 600. The linearly polarized light is then transmitted through the polarizer 600 and goes toward an observer 10000.

On the other hand, light 1003 reflected by the polarized light separating unit 500 is transmitted through the light-emitting layer, etc. while the state of polarization is substantially retained. Then, the light 1003 is reflected by the reflection electrode 300 and goes toward the polarized light separating unit 500 again. At this time, the light 1003 is transmitted through the polarized light separating unit 500 because the phase of the light 1003 shifts by n to convert the light 1003 into circularly polarized light rotating in the reverse direction (e.g., right-hand circularly polarized light) when the light 1003 is reflected by the reflection electrode 300. The light 1003 transmitted through the polarized light separating unit 500 is converted into linearly polarized light by the action of the retarder 700 so that the linearly polarized light can be transmitted through the polarizer 600. Then, the light 1003 is transmitted through the polarizer 600 and goes toward the observer 10000. Hence, a large part of light emitted from the light-emitting layer 106 goes toward the observer 10000 side without being absorbed to the polarizer 600.

That is, light which was absorbed to the polarizer wastefully in the related art is reflected by the polarized light separating unit (cholesteric liquid-crystal layers) before absorbed to the polarizer so that the reflected light can be reused. Hence, there is an effect in improving luminance of the display device.

On this occasion, the light emitted from the light-emitting layer and reflected by the polarized light separating unit (cholesteric liquid-crystal layers) is once reflected by the light-reflecting surface (reflection electrode) and then transmitted through the polarized light separating unit and the polarizer so as to contribute to display. That is, because the light reflected by the polarized light separating unit is reflected only once by the light-reflecting surface, reflection loss can be minimized. Hence, the light can be reused efficiently, so that brighter display can be obtained.

External light incident onto the display device from the surroundings under a bright environment will be described below. External light 3000 incident onto the display device from the surroundings is generally non-polarized light. During passage through the polarizer 600, linearly polarized light having a plane of polarization in a predetermined direction is absorbed to the polarizer 600 but linearly polarized light having a plane of polarization in a direction perpendicular to the predetermined direction is transmitted through the polarizer 600. The linearly polarized light transmitted through the polarizer 600 is converted into circularly polarized light having a rotating plane of polarization (e.g., right-hand circularly polarized light) by the action of the retarder 700.

The light transmitted through the retarder 700 is transmitted through the polarized light separating unit 500. When the light is then reflected by the reflection electrode 300, the phase of the light shifts by n to convert the light into circularly polarized light rotating in the reverse direction (e.g., left-hand circularly polarized light).

The light reflected by the reflection electrode 300 is made incident onto the polarized light separating unit 500. Light 3001 at wavelengths out of the wavelength range of selective reflection by each of the cholesteric liquid-crystal layers constituting the polarized light separating unit 500 is directly transmitted through the polarized light separating unit 500 but light at wavelengths in the wavelength range of selective reflection is reflected by the polarized light separating unit 500.

The light 3001 transmitted through the polarized light separating unit 500 is converted into linearly polarized light by the action of the retarder 700 so that the linearly polarized light can be absorbed to the polarizer 600. Hence, the linearly polarized light is absorbed to the polarizer 600, so that the light does not return to the outside of the display device.

On the other hand, light 3002 reflected by the polarized light separating unit 500 is reflected by the reflection electrode 300 and goes toward the polarized light separating unit 500 again. At this time, the light 3002 is transmitted through the polarized light separating unit 500 because the phase of the light 3002 shifts by n to convert the light 3002 into circularly polarized light rotating in the reverse direction when the light 3002 is reflected by the reflection electrode 300. The light 3002 transmitted through the polarized light separating unit 500 is converted into linearly polarized light by the action of the retarder 700 so that the linearly polarized light can be transmitted through the polarizer 600. Then, the linearly polarized light is transmitted through the polarizer 600 and goes toward the observer 10000.

That is, at least a half part of external light 3000 incident onto the display device is first absorbed to the polarizer 600. The other part of external light 3000 transmitted through the polarizer 600 is reflected by the reflection electrode 300 and made incident onto the polarized light separating unit 500. Light 3001 which is a-part of the external light 3000 reflected by the reflection electrode 300 and which is transmitted through the polarized light separating unit 500 is absorbed to the polarizer 600. For this reason, the light allowed to return to the outside of the display-device is only a slight amount of light 3002 corresponding to the wavelength range of selective reflection by each of the cholesteric liquid-.crystal layers constituting the polarized light separating unit 500.

Accordingly, the display device according to the invention is effective in making black display darker and improving the contrast ratio because of reduction in reflection of external light even under a bright environment.

Incidentally, as shown in FIG. 3, the wavelength distribution of selective reflection by each of the cholesteric liquid-crystal layers constituting the polarized light separating unit 500 is generally precipitous. In addition, as described above, the wavelength range of selective reflection can be adjusted on the basis of An of liquid crystal used and the helical pitch p so as to be narrower than the wavelength range of light emitted from the organic light-emitting diode section.

Generally, even in the case where the peak wavelength of emitted light is the same, color purity (i.e., excitation purity indicating the ratio of distance from the white light source on a chromaticity diagram) is low in terms of hypo chromaticity when the emitted light has a wide wavelength range and a gentle wavelength distribution.

Hence, if the wavelength range of light reflected by the polarized light separating unit 500 to be reused is selected to be narrower and more precipitous than the wavelength range of light emitted from the light-emitting layer, the wavelength distribution of light actually emitted from the display device can become more precipitous than the wavelength distribution of light emitted from the light-emitting layer to thereby make color purity high.

That is, in the display device according to the invention, color purity can be heightened by the amount of reused light reflected by the polarized light separating unit 500 compared with the color purity of light emitted from the organic light-emitting diode section 150 itself. Hence, the color purity of light emitted from each of pixels in accordance with the three primary colors of red, green and blue can be heightened to thereby obtain an effect in achieving a display device having a wide color reproduction range.

In addition, reflection of external light decreases as the wavelength range of selective reflection by each cholesteric liquid-crystal layer is narrowed. Hence, there is an effect in obtaining a higher contrast ratio under a bright environment.

Specifically, as shown in FIG. 3, in order to suppress reflection of external light to thereby achieve a high contrast ratio under a bright environment, it is important that the wavelength ranges of selective reflection by the respective cholesteric liquid-crystal layers are narrowed so that at least the wavelength ranges of main reflection by the cholesteric liquid-crystal layers constituting the polarized light separating unit do not overlap one another.

Figure 4:
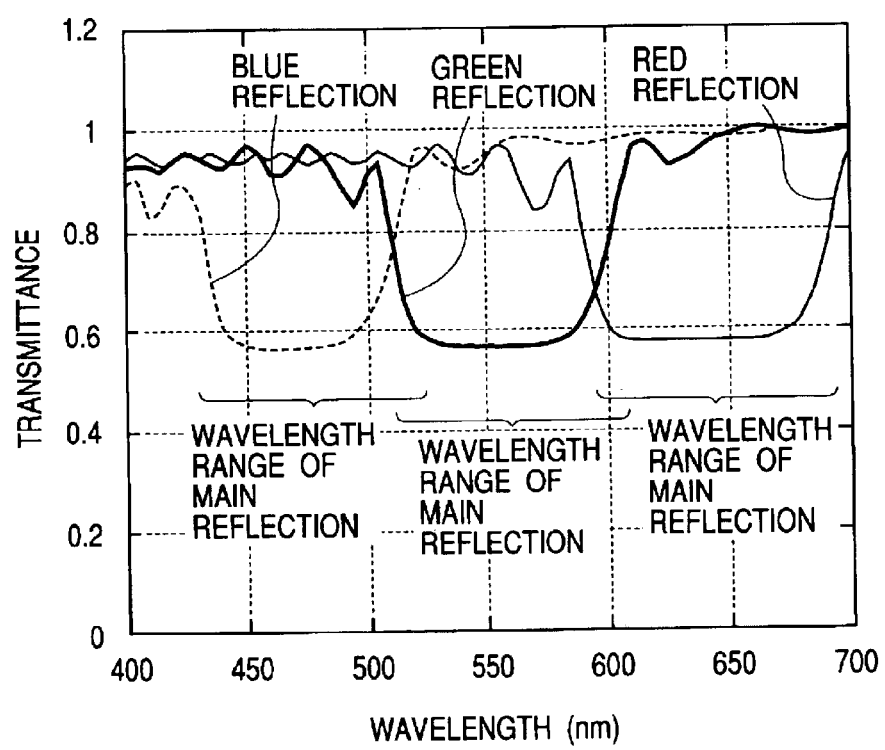
FIG. 4 is a graph showing an example of wavelength dependence of transmittance of cholesteric liquid-crystal layers in the display device according to the invention.

Like FIG. 3, FIG. 4 is a graph showing an example of wavelength dependence of transmittance in the case where non-polarized light is incident onto each cholesteric liquid-crystal layer. FIG. 4 shows an example of transmittance of each of cholesteric liquid-crystal layers exhibiting wavelength ranges of selective reflection corresponding to the three primary colors of red, green and blue in the case where wavelength ranges of main reflection by the cholesteric liquid-crystal layers overlap one another.

Figure 5:
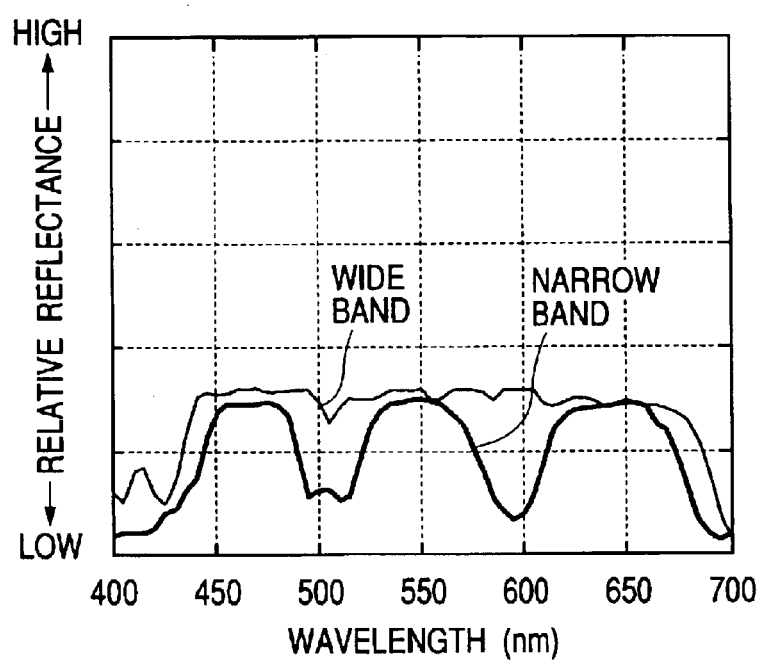
FIG. 5 is a graph showing an example of relative reflectance of external light in the display device according to the invention.

FIG. 5 is a graph showing reflectance of external light in the case where a laminate of three cholesteric liquid-crystal layers as shown in FIGS. 3 and 4 is used as the polarized light separating unit 500. In FIG. 5, the narrow band curve shows the case where the wavelength ranges of main reflection by the cholesteric liquid-crystal layers do not overlap one another as shown in FIG. 3, and the wide band curve shows the case where the wavelength ranges of main reflection by the cholesteric liquid-crystal layers overlap one another as shown in FIG. 4.

As shown in FIG. 5, in the case where the wavelength ranges of main reflection by the cholesteric liquid-crystal layers overlap one another (hereinafter referred to as "wide band"), there is little wavelength region exhibiting low reflectance. On the other hand, in the case where the wavelength ranges of main reflection by the cholesteric liquid-crystal layers do not overlap one another (hereinafter referred to as "narrow band"), reflectance of external light becomes correspondingly lower than that in the wide band case due to the presence of wavelength regions exhibiting low reflectance, among the wavelength ranges of reflection by the cholesteric liquid-crystal layers.

Specifically, in this embodiment, reflectance in the narrow band case is about 70% as much as that in the wide band case, so that the contrast ratio under a bright environment is improved by about 1.4 times.

Incidentally, in the narrow band case, there is fear that the luminance improving effect may be lowered because the wavelength ranges of selective reflection by the cholesteric liquid-crystal layers are narrowed. The portions in which the wavelength ranges of selective reflection are narrowed are, however, wavelength regions little contributing to improvement of luminance in a desired color. Hence, the influence on the luminance improving effect is small.

Accordingly, to improve luminance and suppress external light reflection-simultaneously, it is important that the wavelength ranges of main reflection by the cholesteric liquid-crystal layers constituting the polarized light separating unit 500 do not overlap one another.

Incidentally, as shown in FIG. 3, each of the cholesteric liquid-crystal layers generally has small reflection wavelength peaks at wavelengths out of the main reflection wavelength range. It is however conceived that the small reflection wavelength peaks have small influence because reflection in the small reflection wavelength peaks is small compared with reflection in the main reflection wavelength range.

Figure 6:
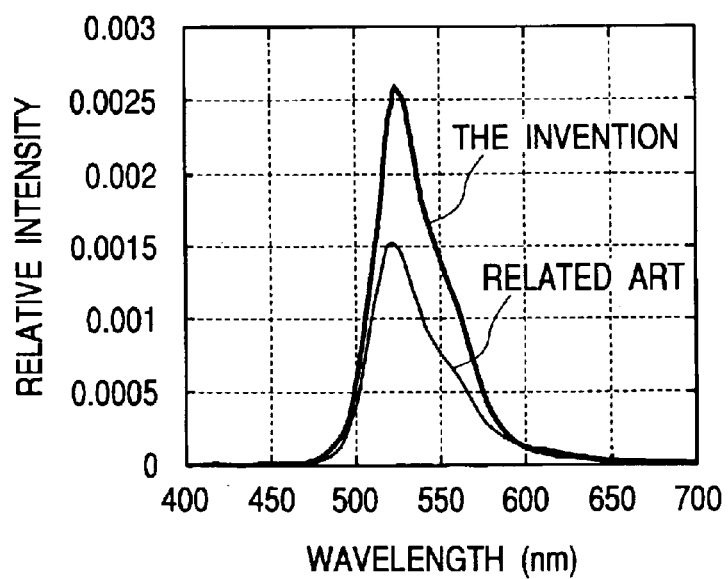
FIG. 6 is a graph showing an example of wavelength dependence of relative intensity of light in the display device according to the invention.

FIG. 6 is a graph showing wavelength dependence of relative intensity of green light in the case where a laminate of narrow-band cholesteric liquid-crystal layers shown in FIG. 3 is used as the polarized light separating unit 500. In FIG. 6, a result of the related-art system in which a circularly polarizing plate is disposed in addition to use of the same organic light-emitting diode section is also shown for the sake of comparison.

As shown in FIG. 6, in the invention, intensity of light increases because light which was absorbed to the polarizer in the related art is reused. Particularly, intensity of light with a wavelength range effective as green light increases. In this case, luminance is improved to 1.64 times as much as that in the related-art system.

As x-y chromaticity coordinates in a CIE1931 chromaticity diagram, $(x, y)=(0.2554, 0.6842)$ is obtained in the invention whereas $(x, y)=(0.2543, 0.6791)$ is obtained in the related art. Hence, color purity (which means excitation purity here) is improved from 93.1% to 93.8%.

Similarly to green, the effect of improving both luminance and chromaticity can be also obtained in the case for blue and red.

Incidentally, as described above, the relation between the wavelength range of light emitted from the organic light-emitting diode section 150 and the wavelength range of selective reflection by each of the cholesteric liquid-crystal layers constituting the polarized light separating unit 500 is important for the display device according to the invention. That is, this relation may be changed in accordance with characteristic regarded as important.

When, for example, both color purity and contrast ratio under a bright environment are regarded as important, it is preferable that the wavelength range of selective reflection by each of the cholesteric liquid-crystal layers constituting the polarized light separating unit 500 is selected to be as narrow as possible. In this case, as the wavelength range of selective reflection is narrowed, reflection of external light is reduced and the contrast ratio is improved but the effect of improving luminance of the display device is however lowered correspondingly to the narrowed wavelength range. Hence, the wavelength range of selective reflection may be preferably decided in consideration of the environment in use (supposed ambient brightness).

Generally, the wavelength range of selective reflection by each of the cholesteric liquid-crystal layers varies in accordance with the incident angle of light. For this reason, the resulting color may vary in accordance with the angle of observation when the wavelength range of selective reflection by each of the cholesteric liquid-crystal layers constituting the polarized light separating unit 500 is narrow.

To suppress this color change, it is preferable that the wavelength ranges of selective reflection by the cholesteric liquid-crystal layers constituting the polarized light separating unit 500 are widened so that the wavelength ranges of main reflection by the cholesteric liquid-crystal layers overlap one other to thereby obtain substantially uniform selective reflection at wavelengths in the visible region.

In this case, reflection of external light, however, increases. It is therefore preferable that color filters are further provided in order to achieve a high contrast ratio under a bright environment. That is, it is preferable that a color filter capable of transmitting red light is disposed on the red light-emitting layer, a color filter capable of transmitting green light is disposed on the green light-emitting layer and a color filter capable of transmitting blue light is disposed on the blue light-emitting layer. In this case, about ⅔ of external light incident onto the display device is absorbed to the color filters when the external light passes through the color filters. Hence, reflection of external light is lowered, so that the contrast ratio under a bright environment is improved.

Incidentally, when the cholesteric liquid-crystal layers constituting the polarized light separating unit 500 are made of a common liquid-crystal material for red, green and blue, each wavelength range of selective reflection becomes wide theoretically as the central wavelength of selective reflection becomes long. That is, the wavelength range of selective reflection by a cholesteric liquid-crystal layer corresponding to red light is wider than the wavelength range of selective reflection by a cholesteric liquid-crystal layer corresponding to blue or green light, so that the effect of improving the contrast ratio or the effect of improving color purity by the cholesteric liquid-crystal layer corresponding to red light is smaller.

Hence, in this case, the central wavelength of selective reflection by the cholesteric liquid-crystal layer corresponding to red light is preferably selected to be longer than the peak wavelength of light emitted from the organic light-emitting diode section so that the wavelength range of selective reflection in the visible region coincides with the wavelength range of light emitted from the organic light-emitting diode section.

As described above, in the display device having a light-emitting element having a light-emitting layer, and a light-reflecting surface disposed on a back surface of the light-emitting layer according to the invention, a polarized light separating unit, a retarder and a polarizer are disposed on a front surface of the light-emitting layer, If such a condition is satisfied, the same effect as described above can be obtained even in any other configuration than the configuration described above.

When, for example, the display device has a polarized light separating unit, a retarder and a polarizer which are disposed on a front surface of a plasma display, the polarized light separating unit constituted by a laminate of polarized light separating layers provided in accordance with the number of colors in light emitted from the light-emitting layer (fluorescent substance), the following effect can he obtained.

In this case, the light-emitting layer is not provided for achieving all the effects of the invention because the state of polarization of light transmitted through the light-emitting layer is not retained as well as the light-reflecting surface is not a reflecting surface provided for reflecting perpendicularly incident circularly polarized light rotating in one direction to form circularly polarized light rotating in the reverse direction. The polarized light separating unit is, however, formed so that the wavelength ranges of main reflection by the plurality of polarized light separating layers constituting the polarized light separating unit do not overlap one another. Hence, an effect of improving color purity and widening the display color range can be obtained in the same manner as described above.

(Embodiment 1)

Figure 7:
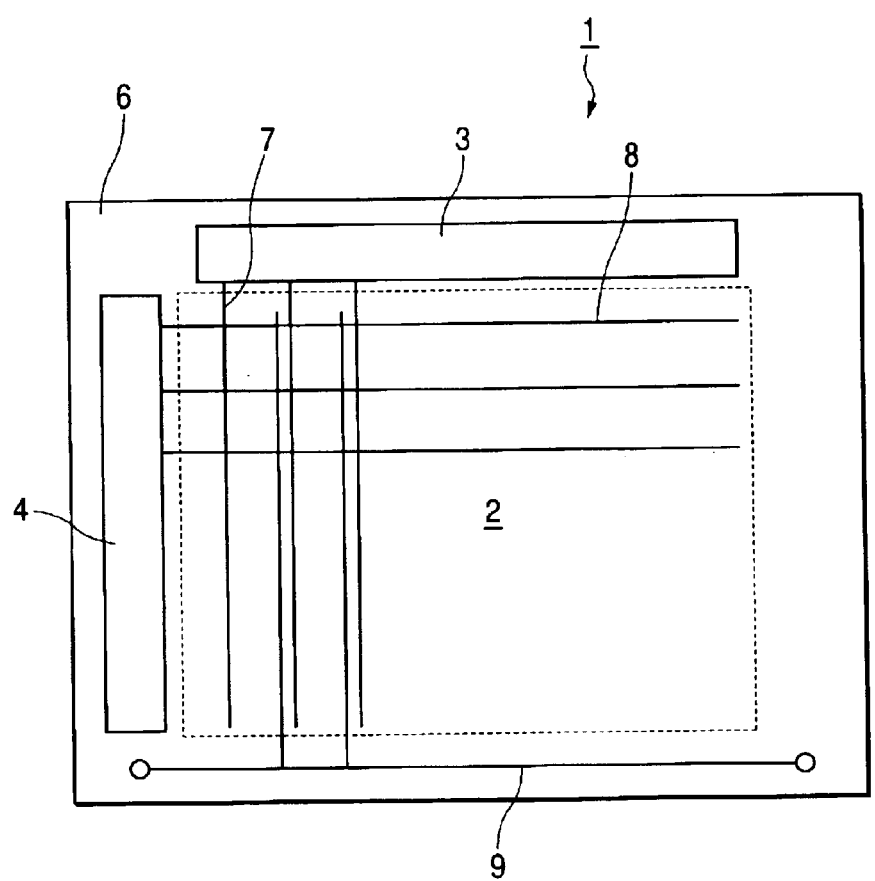
FIG. 7 is a block diagram typically showing the overall layout of the display device according to-the invention.
Figure 8:
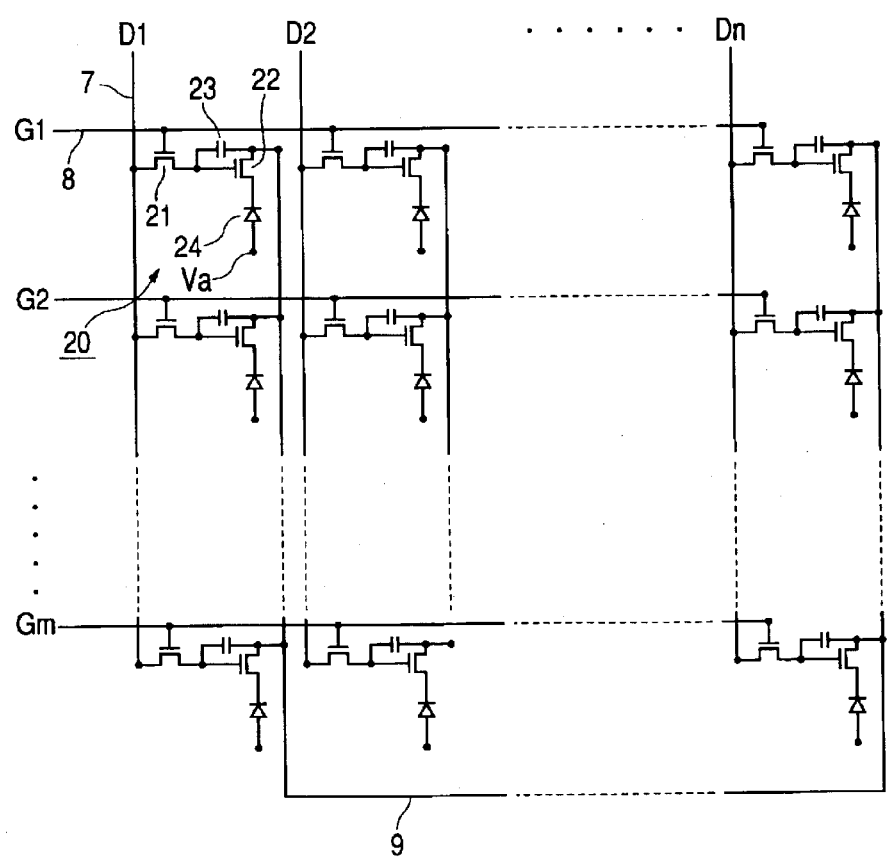
FIG. 8 is an equivalent circuit diagram showing an example of an active matrix type formed in a display portion of the display device according to the invention.

FIG. 7 is a block diagram typically showing the overall layout of a display device 1 according to this embodiment. FIG. 8 is an equivalent circuit diagram of an active matrix formed in a display portion of the display device 1.

As shown in FIG. 7, the display device 1 has a display portion 2 provided in a substantially central portion of a substrate 6. A data drive circuit 3 for supplying an image signal to each data line 7 is disposed on an upper side of the display portion 2. A scanning drive circuit 4 for supplying a scanning signal to each gate line 8 is disposed on a left side of the display portion 2. Each of these drive circuits 3 and 4 is constituted by a shift register circuit, a level shifter circuit, an analog switch circuit, etc. as represented by a complementary circuit using N-channel and P-channel TFTs (Thin Film Transistors).

Like an active matrix liquid-crystal display device, the display device 1 has a plurality of gate lines and a plurality of data lines provided on the first substrate 6. The data lines are extended in a direction crossing the direction of extension of the gate lines. As shown in FIG. 8, pixels 20 are disposed at points of intersection between the gate lines G1, G2, . . . , Gm and the data lines D1, D2, . . . , Dn to thereby form a matrix.

Each of the pixels contains a light-emitting element 24, a storage capacitor 23, a switching transistor 21, and a driver transistor 22. The switching transistor 21 is constituted by an N-channel TFT having a gate electrode connected to a gate line, a source or drain electrode connected to a data line, and the other electrode connected to the storage capacitor 23. The driver transistor 22 is constituted by an N-channel TFT having a gate electrode connected to the storage capacitor 23, a source electrode connected to a common potential wire 9 extended in the same direction as the direction of extension of the data line, and a drain electrode connected to one electrode (cathode) of an organic light-emitting diode constituting the light-emitting element 24.

The other electrode (anode) of the organic light-emitting diode constituting the light-emitting element 24 is connected to a current supply line common to all the pixels, so that the potential of the other electrode (anode) is kept constant (Va).

The light-emitting elements 24 each of which emits any one of red light, green light and blue light are disposed in a predetermined sequence to form a matrix.

According to the configuration, when the switching transistor 21 is switched on by a scanning signal, an image signal from the data line is written in the storage capacitor 23 through the switching transistor 21. Hence, even in the case where the switching transistor 21 is switched off, the gate electrode of the driver transistor 22 is kept at a potential corresponding to the image signal by the storage capacitor 23. The driver transistor 22 is continuously activated in a source-grounding mode excellent in constant-current characteristic, so that a current from the current supply line flows in the organic light-emitting diode constituting the light-emitting element 24. Hence, a light-emitting state is kept. On this occasion, luminance of emitted light depends on data written in the storage capacitor 23. Interruption of light emission is achieved when the driver transistor 22 is switched off.

Figure 9:
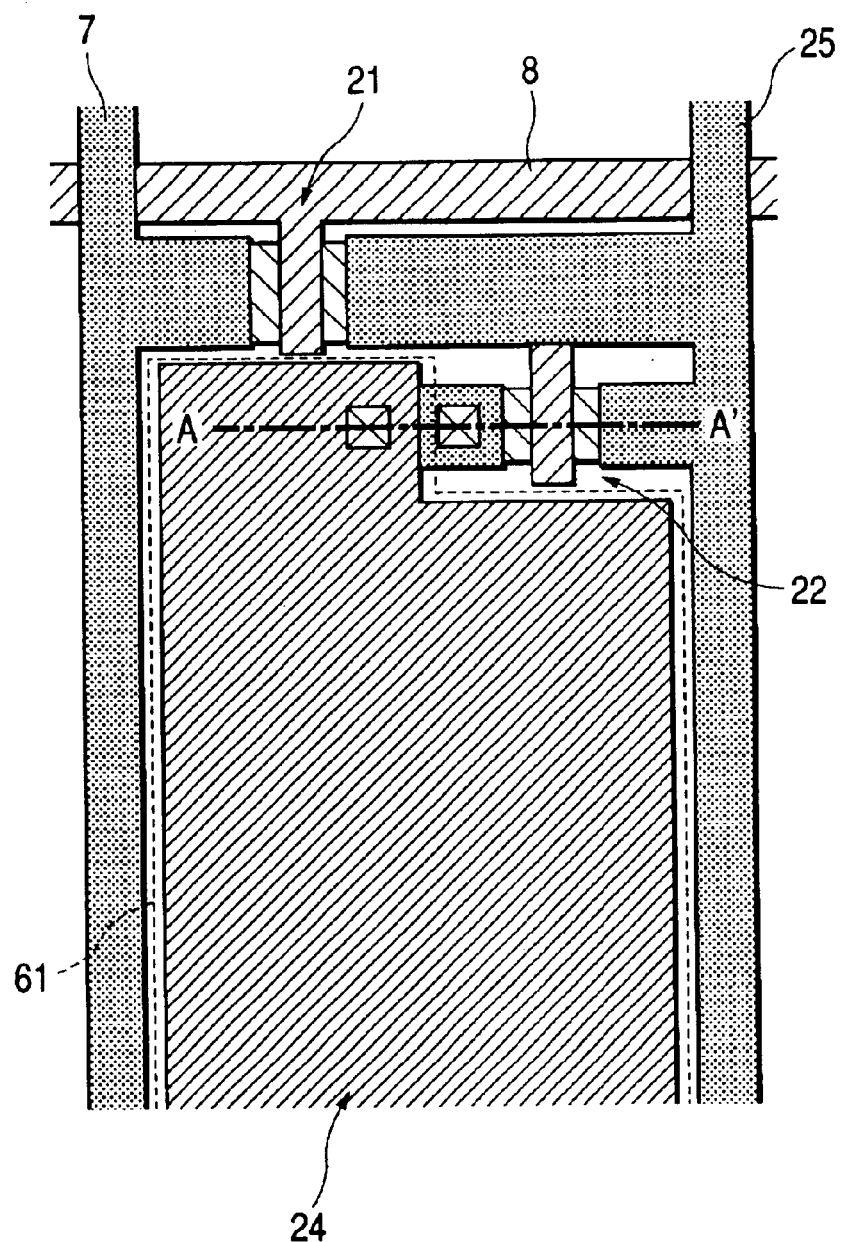
FIG. 9 is a partly plan view showing an example of the structure of a pixel portion in the display device according to the invention.
Figure 10:
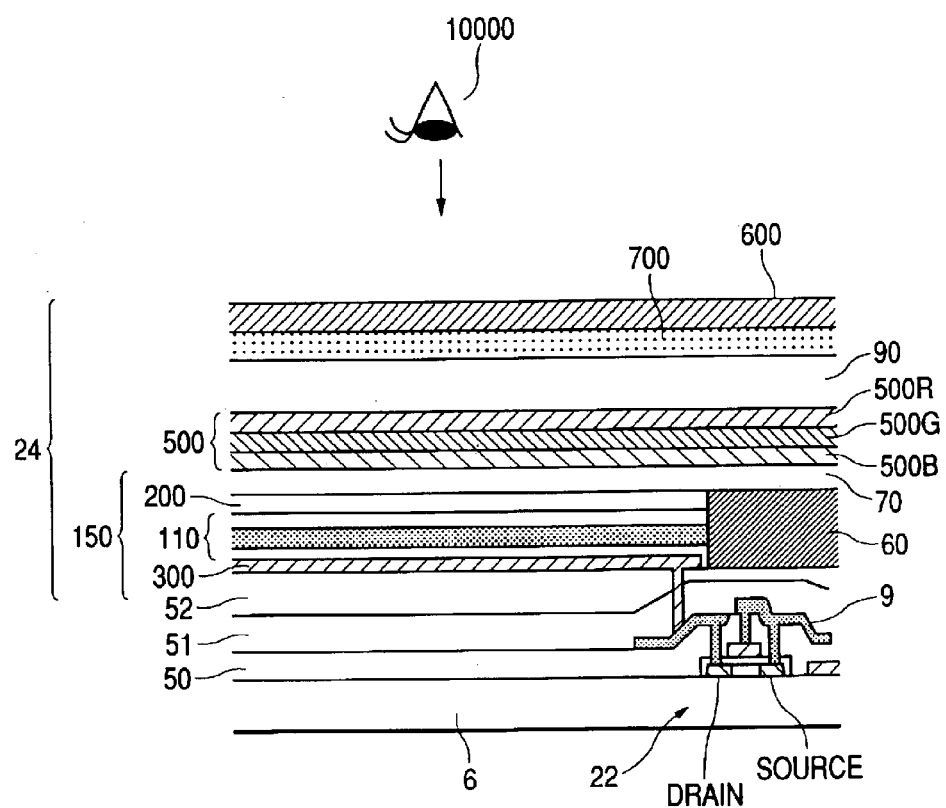
FIG. 10 is a partly sectional view showing the example of the structure of the pixel portion in the display device according to the invention.
Figure 11:
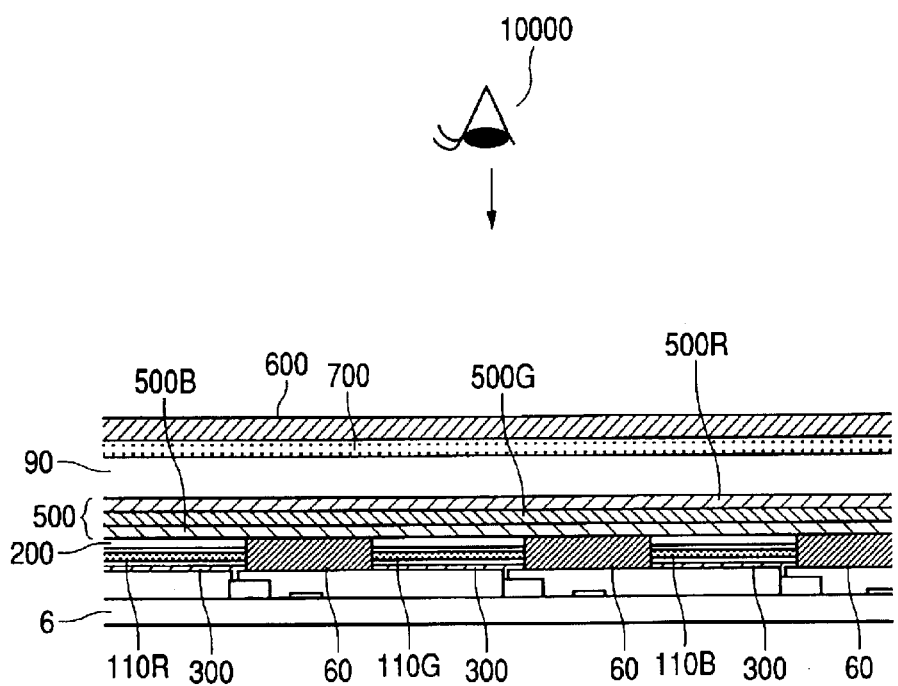
FIG. 11 is a partly schematic sectional view showing an example of the display device according to the invention.

The structure of the display device 1 will be described below with reference to FIGS. 9, 10 and 11. FIG. 9 is a partly schematic view of a planar structure of a pixel portion of the display device 1. FIG. 10 shows a sectional structure taken along the line A-A' in FIG. 9. FIG. 11 is a schematic configuration view showing a part section of the display-device 1. FIG. 11 shows the case where the organic layer 110 is divided into an organic layer 110R for emitting red light, an organic layer 110G for emitting green light and organic layer 110B for emitting blue light.

Island silicon films for forming the switching transistors 21 and the driver transistors 22 are formed on the first substrate 6 made of a flat material such as glass. Gate electrically insulating films are formed on surfaces of the island silicon films. Gate electrodes, gate lines and electrodes for storage capacitors are formed on the gate electrically insulating films. Then, source and drain regions are formed on the gate electrodes while self-matched with the gate electrodes.

A first interlayer electrically insulating film 50 is further provided. Data lines, a common potential wire and storage capacitor electrodes are formed through contact holes. A second interlayer electrically insulating film 51 and a flattening film 52 made of an electrically insulating material are further formed. Reflection electrodes 300 functioning as cathodes of the light-emitting elements 24 are formed on the flattening film 52 so as to be shaped like islands. The reflection electrodes 300 are connected to drain electrodes of the driver transistors 22 through contact holes formed in the second interlayer electrically insulating film 51 and the flattening film 52.

Partition walls 60 each made of a photosensitive resin material containing a light-absorbing black pigment dispersed therein are formed on the flattening film 52 so that regions in which the reflection electrodes 300 are formed are surrounded by the partition walls 60 respectively. The partition walls 60 are formed by photolithography.

An organic layer 110 is provided so as to be divided into a predetermined arrangement of organic layers each containing a light-emitting layer for emitting any one of red light, green light and blue light individually. Such organic layers are provided on the reflection electrodes 300 respectively. The organic layer 110 may be selected in accordance with the configuration and material described above. When the organic layer 110 is made of a low-molecular compound, a known technique for forming a film by patterning a vacuum vapor deposited organic film using a shadow mask (e.g., as described in S. Miyaguchi, et al.: "Organic LED Fullcolor Passive-matrix Display", Journal of the SID, 7, 3, pp. 221–226 (1999) ) can be used for dividing-the organic layer 110. In this process, the partition walls 60 can be used as butt-contact members for the shadow mask.

When the organic layer 110 is made of a polymer-based material, a known ink-jet patterning technique (e.g., as described in T. Shimada, et al.: "Multicolor Pixel Patterning of Light-Emitting Polymers by Ink-Jet Printing", SID 99 DIGEST, 376 (1999)) can be used. In this process, the partition walls 60 function as banks for separating pixel-regions.

Transparent electrodes 200 functioning as anodes are entirely formed as counter electrodes on the organic layer 110. The transparent electrodes 200 are connected to a current supply line not shown.

As occasion demands, a flattening film 70 made of a transparent electrically insulating material is formed on the transparent electrodes 200. The flattening film 70 is provided for the double purpose of protecting the transparent electrodes 200 and facilitating lamination of a member thereon.

The flattening film 70 may be made of a transparent organic material such as an acrylic-based resin, a benzocyclobutene resin or a polyimide-based resin. When a film is formed from the organic material by a spin coating method or the like, a surface of the film can be flattened relatively easily.

A second substrate 90 constituted by an optically isotropic, transparent and flat substrate is disposed above the flattening film 70. A polarized light separating unit 500 is formed on one surface of the second substrate 90. A retarder 700 and a polarizer 600 are laminated and disposed on the other surface of the second substrate 90. The second substrate 90 is laminated so that a surface of the second substrate 90 on which the polarized light separating unit 500 is formed faces a surface of the first substrate 6 on which the organic layer 110 is, formed.

The second substrate 90 can be made of transparent glass. Alternatively, the second substrate 90 may be made of a polymer film such as a polycarbonate film or a triacetyl cellulose film by a casting method, or made of an optically isotropic plastic sheet or film such as a sheet or film of an alicyclic acrylic resin (trade name: OPTOREZ made by Hitachi Chemical Co., Ltd.) by injection molding. When a high-molecular film or a resin sheet is used, a gas barrier process may be applied to the high-molecular film or the resin sheet to form a gas barrier layer thereon or a glass sheet having a thickness of tens of $\mu$m may be stuck to the high-molecular film or the resin sheet.

If a process can be made to obtain sufficient gas barrier performance, the second substrate may be omitted so that only a laminate of the polarized light separating unit 500, the retarder 700 and the polarizer 600 are formed.

The polarized light separating unit 500 is constituted by a laminate of cholesteric liquid-crystal layers which have wavelength ranges of selective reflection in accordance with the colors of light emitted from the light-emitting layers constituting the organic layer 110 and which are provided by a number corresponding to the number of the colors of light emitted from the light-emitting layers. In this embodiment, a cholesteric liquid-crystal layer 500R for reflecting red light, a cholesteric liquid-crystal layer 500G for reflecting green light and a cholesteric liquid-crystal layer 500B for reflecting blue light are laminated in accordance with the emitted light colors of red, green and blue. Incidentally, as described above, the relation between the wavelength range of selective reflection by each cholesteric liquid-crystal layer and the wavelength range of light emitted from the organic layer 110 is selected so that the wavelength ranges of main reflection of selective reflection by the cholesteric liquid-crystal layers do not overlap one another.

A method for forming the polarized light separating unit 500 constituted by the cholesteric liquid-crystal layers on the second substrate 90 will be described below. The following method can be used as a method for forming the polarized light separating unit 500 by laminating cholesteric liquid-crystal layers having wavelength ranges of selective reflection of red, green and blue respectively.

A liquid-crystal polymer is applied on the second substrate 90 oriented then, the temperature is adjusted to a predetermined value by using temperature dependence of selective reflection wavelength. Then, the structure is fixed by crosslinking to thereby form a cholesteric liquid-crystal layer having a desired wavelength of selective reflection. A new liquid-crystal polymer is further applied on the cholesteric liquid-crystal layer. Then, the temperature is adjusted to another predetermined value. Then, the structure is fixed by crosslinking to thereby form a-cholesteric. liquid-crystal layer having another desired wavelength of selective reflection. This process is repeated by a necessary number of times. In this manner, a laminate of cholesteric liquid-crystal layers having desired wavelength ranges of selective reflection can be formed.

Alternatively, a method of controlling the wavelength of selective reflection in accordance with irradiation with light may be used. This method is performed as follows. In a system in which a photo acid generator is added into a side-chain liquid-crystal polymer containing as a component monomer units having optically active groups bonded to one another through Schiff base, the optically active groups are cut off by irradiation with ultraviolet rays to thereby control the wavelength of selective reflection. That is, though the helical pitch of the cholesteric liquid-crystal layer varies in accordance with the optically active group-containing monomer unit content of the liquid-crystal polymer (copolymer), the wavelength of selective reflection is decided on the basis of the helical pitch. Hence, in this method, the monomer unit content is controlled to thereby control the wavelength of selective reflection.

As the optically active group-containing monomer unit content increases, the pitch decreases and the wavelength of selective reflection shifts to a short wavelength side. Hence, a liquid-crystal polymer exhibiting a wavelength of selective reflection of not longer than the wavelength of blue light may be preferably used as a base.

In this case, a liquid-crystal polymer is applied on the second substrate 90 oriented. The liquid-crystal polymer is irradiated with an amount of ultraviolet rays to obtain a desired wavelength of selective reflection. Then, the structure is fixed by heating to thereby form a cholesteric liquid-crystal layer having a desired wavelength of selective reflection. After the cholesteric liquid-crystal layer is cooled, a new liquid-crystal polymer is applied on the cholesteric liquid-crystal layer and irradiated with an amount of ultraviolet rays to obtain another desired wavelength of selective reflection. Then, the structure is fixed by heating and then cooled to thereby form a cholesteric liquid-crystal layer having another desired wavelength of selective reflection. This process is repeated by a necessary number of times. In this manner, a laminate of cholesteric liquid-crystal layers having desired wavelengths of selective reflection can be formed.

Alternatively, film-like cholesteric liquid-crystal layers having different wavelengths of selective reflection may be prepared in advance and laminated through transparent adhesive agents so that a laminate of cholesteric liquid-crystal layers having desired wavelengths of selective reflection can be formed.

The method for forming the polarized light separating unit by laminating cholesteric liquid-crystal layers having desired wavelengths of selective reflection is not limited to these examples. Any other method may be used alternatively. In that case, it is preferable that the total thickness of the polarized light separating unit is as small as possible to make the display device thin.

Incidentally, a transparent protective layer may be provided on a surface of each cholesteric liquid-crystal layer as occasion demands.

A retarder 700 and a polarizer 600 are laminated and disposed on a surface of the second substrate 90 opposite to the surface on which the polarized light separating unit 500 is formed. As described above, the retarder 700 and the polarizer 600 are bonded by acrylic-based transparent adhesive agents respectively.

Incidentally, the polarized light separating unit may be formed directly on the retarder without use of the second substrate. In this case, a material having no influence on the characteristic such as retardation of the retarder may be preferably used in the process of forming each cholesteric liquid-crystal layer.

The first substrate 6 and the second substrate 90 may be entirely stuck to each other by a transparent pressure sensitive adhesive agent. Alternatively, the first substrate 6 and the second substrate 90 may be hermetically sealed and bonded to each other in the condition that the circumference of the display portion is sealed in the form of a frame with a sealing member containing spacer materials such as beads or rods and nitrogen is enclosed.

Figure 12:
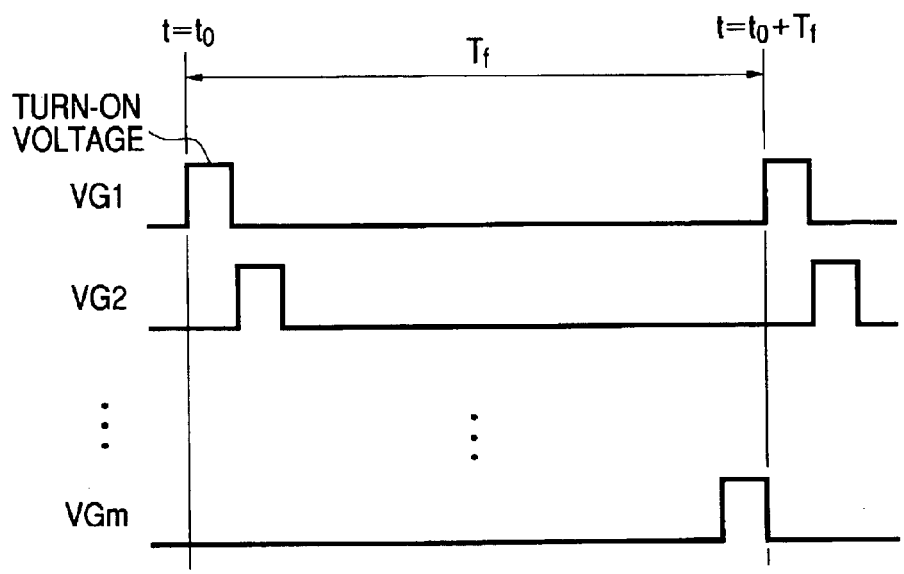
FIG. 12 is a time chart for explaining a displaying operation of the display device according to the invention.

The displaying operation of the display device 1 will be described below with reference to FIGS. 8, 12 and 13. FIG. 12 is a time chart showing voltages VG1, VG2, ..., VGm applied to gate lines G1, G2, ..., Gm successively.

Figure 13:
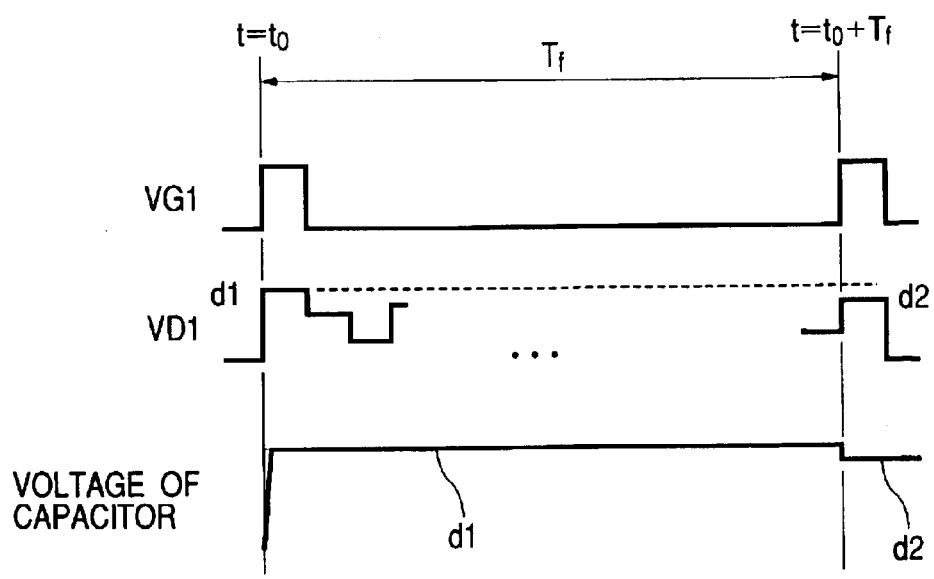
FIG. 13 is a time chart for explaining a displaying operation of the display device according to the invention.

FIG. 13 is a time chart showing the state of gate voltage VG1 and data voltage VD1 and the voltage of the storage capacitor 23 located in row 1, column 1 by way of example.

As shown in FIG. 12, voltages VG1, VG2, ..., VGm are applied to gate lines G1, G2, ..., Gm to turn on switching transistors 21 successively.

Assuming now that a voltage VG1 is applied to a gate line G1 at time $t=t_0$ to turn on switching transistors 21, then vertical scanning is performed once in a frame time $T_f$ and a turn-on voltage is applied to the gate line G1 again at time $t=t_0+T_f$. In this drive scheme, the time required for applying a turn-on voltage to one gate line is-not longer than $T_f/m$. Generally, a time of about 1/60 seconds is used as the value of $T_f$.

When a turn-on voltage is applied to a certain gate line, all switching-transistors connected to the gate line are switched on so that data voltages corresponding to an image signal are synchronously applied to data lines D1, D2, ..., Dn respectively. This is a so-called line-sequential scanning method. This method is popularly used in active matrix liquid crystal.

The state of the gate voltage VG1, the data voltage VD1 and the voltage of the storage capacitor 23 in a pixel located in row 1, column 1 will be described below with reference to FIG. 13.

Assume that d1 is the value of the data voltage VD1 synchronized with VG1 at $t=t_0$, and that d2 is the value of the data voltage VD1 at $t=t_0+T_f$ in the next frame. In this case, while a turn-on voltage is applied to the gate line G1, the data voltage d1 or d2 is stored in the storage capacitor 23 so that the storage capacitor 23 is substantially kept constant for a frame time. The voltage value decides the gate voltage of the driver transistor 22 to thereby control the value of a current flowing in the transistor. Hence, a constant current decided on the basis of the voltage (constant) applied between the storage capacitor 23 and the common potential wire and the voltage Va (constant) applied to the transparent electrode flows in the light-emitting element to thereby generate predetermined light emission.

That is, voltages corresponding to image information are applied through data lines in synchronism-with application of a turn-on voltage to a gate line corresponding to a pixel in which the amount of light emission will be controlled. Hence, the amount of light emitted from the pixel can be controlled. Accordingly, when the amounts of light emitted from a plurality of pixels constituting the display portion 2 are controlled in accordance with image information, a required image can be displayed. Incidentally, because the response time before start of light emission after application of a voltage between cathode and anode ends of each light-emitting element is generally not longer than 1 $\mu$s, image display capable of following a high-speed motion image can be achieved.

Generally, as the current flowing in an organic light-emitting diode increases, the amount of light emitted from the organic light-emitting diode increases so that bright display can be obtained. In this case, electric power consumed by the organic light-emitting diode, however, increases correspondingly so that the life of the device (e.g., the initial half-life period of the amount of emitted light) is shortened.

As described above, luminance of the display device 1 according to the invention is improved to be not lower than 1.6 times because light absorbed to the polarizer as loss in the related art can be used as display light efficiently by the action of the polarized light separating unit. Hence, the display device exhibiting high luminance and bright display can be provided if the consumed electric power is constant. In other words, the current flowing in each light-emitting element can be reduced if luminance (brightness) is constant. There is an effect in achieving the display device having a longer life.

Moreover, the display device 1 has an effect that color purity of light actually given to the observer side is improved by the action of the polarized light separating unit compared with the color of light itself emitted from the light-emitting layer. Hence, there is an effect that the display color range of the display device is widened.

Moreover, the display device 1 is formed so that a partition wall containing a light-absorbing pigment dispersed therein is provided to surround the light-emitting element contained in each pixel. Because light emitted from the light-emitting layer in a direction parallel to the substrate surface is shielded by the partition wall, display free from image blur can be obtained. The partition wall is further provided so that light emitted from the light-emitting layer and reflected by the polarized light separating unit can be prevented from leaking into other pixels. Hence, there is an effect that color mixing or blur can be prevented.

That is, because the pixels are optically separated from one another by the partition walls, high-grade display free from color mixing or blur can be obtained.

Moreover, the partition wall can serve as a spacer required when the first substrate having the organic light-emitting diodes formed thereon and the second substrate having the polarized light separating unit formed thereon are stuck to each other. In this case, there is an effect that a defect can be prevented from being caused by contact between each organic light-emitting diode and the polarized light separating unit.

Moreover, the polarized light separating unit, the retarder and the polarizer are formed planarly. Hence, it is unnecessary to align them with the organic layer divided, that is, with the pixels. There is an effect that productivity is improved.

Description has been made upon the case where the polarized light separating unit and each organic light-emitting diode are formed on different substrates respectively and finally stuck to each other. This is because there is the possibility that failure such as deterioration of the organic layer may occur when a laminate of cholesteric liquid-crystal layers is formed as the polarized light separating unit in the case where the polarized light separating unit and each organic light-emitting diode are formed on one substrate, e.g., in the case where the polarized light separating unit is formed on a substrate on which the organic layer-or the like has been already formed.

That is, if the polarized light separating unit and each organic light-emitting diode are formed on different substrates respectively, the degree of freedom for each process is widened. Hence, the two can be prevented from deteriorating each other, so that a higher performance device can be formed.

Incidentally, the polarized light separating unit and each organic light-emitting diode may be formed on one substrate, for example, when an organic material high in durability will be developed in the future.

Incidentally, if the distance between the polarized light separating unit and the reflection electrode contained in a corresponding pixel in the display device according to the invention is too long, there are harmful effects that light reflected by the polarized light separating unit may leak into a reflection electrode contained in another pixel to thereby reduce resolution, or light emitted from the light-emitting layer and light reflected by the polarized light separating unit may be absorbed to the partition wall to thereby reduce the intensity of light going toward the observer. It is therefore preferable, from the point of view of image quality and efficiency in utilization of emitted light, that the distance between the polarized light separating unit and the reflection electrode is as short as possible.

Assuming now that a substrate is interposed between the organic light-emitting diode and the polarized light separating unit, then the thickness of the substrate is hundreds of $\mu$m when the substrate is made-of glass or the thickness of the substrate is tens of $\mu$m when the substrate is made of a plastic film. Hence, the distance between the polarized light separating unit and the reflection electrode is too long.

On the other hand, the display device according to the invention is formed so that light is taken out from a side of the organic light-emitting diode opposite to the first substrate on which the organic light-emitting diode is formed, and that the polarized light separating unit is stuck through a transparent thin flattening film or an electrically insulating film. According to this configuration, the distance between the polarized light separating unit and each reflection electrode is not longer than 10 $\mu$m. Hence, light absorbed to the partition walls as loss is reduced so that efficiency in utilization of light emitted from the light-emitting layer is improved. Hence, brighter display can be obtained. In addition, in this case, light reflected by the polarized light separating unit can be prevented from leaking into the reflection electrodes contained in other pixels. Hence, because lowering of resolution,. color mixing, or the like, can be prevented from being caused by the light leakage, there is an effect that high-grade display can be obtained.

Any arrangement such as stripe arrangements mosaic arrangement or delta arrangement can be used as the arrangement of the pixels constituting the display portion of the display device. A suitable arrangement may be selected in accordance with the specification of the display device.

Although this embodiment has been described upon the case where the display device is of an active matrix drive type, the invention is not limited thereto. That is, the invention may be also applied to the case where the display device is a passive matrix drive type in which electrodes of each light-emitting element used in the invention are directly connected to vertical and horizontal scanning lines respectively without provision of any switching device such as a TFT and-driven.

When the display device is of an active matrix drive type, the circuit configuration of the active matrix is not limited to the configuration. For example, each pixel may contain four switching devices to form a circuit configuration in which variation in threshold characteristic of the switching devices is corrected.

(Embodiment 2)

Figure 14:
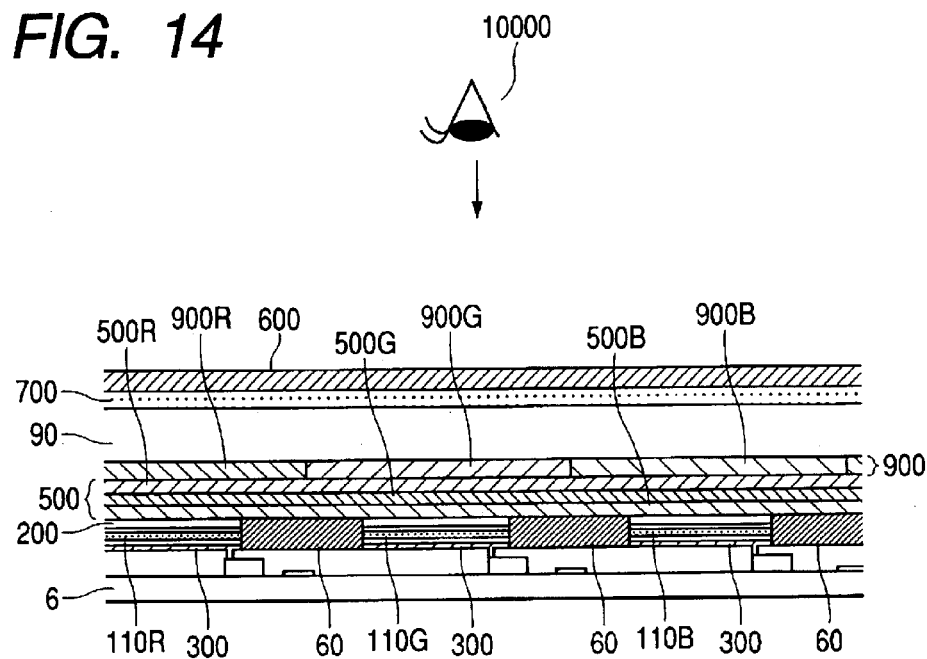
FIG. 14 is a partly schematic sectional view showing an example of the display device according to the invention.

A display device according to this embodiment will be described below. FIG. 14 is a partly sectional view schematically showing the display device. The display device is basically configured in the same manner as in Embodiment 1 except that a color filter unit is provided. Hence, like numerals refer to like parts for the sake of omission of duplicated description.

As shown in FIG. 14, the display device according to this embodiment is configured in the same manner as in Embodiment 1 described with reference in FIG. 11, except that a color filter unit 900 capable of transmitting light in a predetermined wavelength range but absorbing light at wavelengths in the visible region excluding the predetermined wavelength range is disposed between the second substrate 90 and the polarized light separating unit 500.

The construction of the color filter unit 900 may be obtained, for example, by dividing the color filter unit 900 into color filters provided on the second substrate 90 by a known technique such as a dyeing method, a pigment dispersing method or a printing method. That is, the color filter unit 900 is divided by colors so that a color filter 900R capable of transmitting red light is positioned to cover the red light-emitting organic layer 110R, a color filter 900G capable of transmitting green light is positioned to cover the green light-emitting organic layer 110G, and a color filter 900B capable of transmitting blue light is positioned to cover the blue light-emitting organic layer 110B.

The polarized light separating unit 500 may be formed in the same manner as in Embodiment 1 after a protective layer of a transparent resin material not shown is formed on the color filter unit 900 as occasion demands.

The second substrate 90 on which the color filter unit 900 and the polarized light separating unit 500 have been already formed is laminated to the first substrate 6 so that the surface of the second substrate 90 where the polarized light separating unit 500 has been formed faces the surface of the first substrate 6 where the organic layer 110 has been formed. On this occasion, after the first substrate 6 and the second substrate 90 are aligned with each other so that the position of the organic layer 110 divided by colors substantially coincides with the position of the color filter unit 900 divided by colors, the surfaces of the first and second substrates 6 and 90 are entirely stuck to each other by a transparent pressure sensitive adhesive agent or nitrogen is enclosed and then the first and second substrates 6 and 90 are hermetically bonded to each other by a frame-like sealing member which contains a spacer material such as beads and which surrounds the display device.

The retarder 700 and the polarizer 600 are bonded, by a transparent adhesive agent, to a surface of the second substrate 90 opposite to the surface of the second substrate 90 where the polarized light separating unit 500 has been formed.

The operation of the display device will be described below. The light-emitting operation of the display device is the same as in Embodiment 1. That is, in synchronism with application of a turn-on voltage to a gate line corresponding to a pixel in which the amount of emitted light will be controlled, a voltage corresponding to image information is applied through a data line to thereby control the amount of light emitted from the pixel. The amounts of light emitted from a plurality of pixels constituting the display portion are controlled in accordance with image information to thereby display a desired image.

Light emitted from the organic layer 110 becomes incident onto the polarized light separating unit 500 directly or after reflected by each reflection electrode 300. The polarized light separating unit 500 is constituted by a laminate of cholesteric liquid-crystal layers exhibiting wavelength ranges of selective reflection of light with colors to be displayed by the pixels respectively.

Hence, of the light emitted from the red light-emitting organic layer 110R so as to be incident onto the polarized light separating unit 500, a circularly polarized light component rotating in one direction (e.g., left-hand circularly polarized light component) is selectively reflected by one 500R of the cholesteric liquid-crystal layers constituting the polarized light separating unit 500 but the other light component is transmitted through the polarized light separating unit 500.

The light transmitted through the polarized light separating unit 500 is further transmitted through the color filter 900R capable of transmitting red light. Then, the light as circularly polarized light is converted into linearly polarized light by the action of the retarder 700. The linearly polarized light is transmitted through the polarizer 600 and goes toward the observer 10000.

On the other hand, the light reflected by the polarized light separating unit 500 is further reflected by each reflection electrode 300 and goes toward the polarized light separating unit 500 again. At this time, the light is transmitted through the polarized light separating unit 500 because the phase of light shifts by H to thereby convert the light into a circularly polarized light component rotating in the reverse direction (e.g., right-hand circularly polarized light component) when the light is reflected by the reflection electrode 300. The light transmitted through the polarized light separating unit 500 is further transmitted through the red color filter 900R and converted into linearly polarized light by the action of the retarder 700 so that the linearly polarized light can be transmitted through the polarizer 600. Then, the linearly polarized light is transmitted through the polarizer 600 and goes toward the observer 10000.

Similarly, light emitted from an organic layer 110G (or 110B) corresponding to a pixel for displaying green (or blue) is transmitted through the color filter 500G (or color filter 500B) and the polarizer 600 and goes toward the observer 10000, Hence, bright green (or blue) light can be obtained.

Also in this embodiment, like Embodiment 1, wasteful light absorbed to the polarizer in the related art can be used effectively so that luminance of each light-emitting element can be improved. Hence, there is an effect that bright display can be obtained.

Incidentally, at least a half part of external light incident onto the display device is absorbed to the polarizer 600 when the external light passes through the polarizer 600. The light transmitted through the polarizer 600 is further transmitted through the polarized light separating unit 500, the color filter unit 900, etc. and reflected by each reflection electrode 300, so that the resulting light is incident onto the polarized light separating unit 500 again. Of light incident onto the polarized light separating unit 500, light at wavelengths out of the wavelength range of reflection by the-polarized light separating unit 500 is transmitted through the polarized light separating unit 500 and absorbed to the polarizer 600. On the other hand, light in the wavelength range of reflection by the polarized light separating unit 500 is reflected by the polarized light separating unit 500 and further reflected by each reflection electrode 300 again. Then, the light is transmitted through the polarized light separating unit 500, the color filter unit 900, the retarder 700 and the polarizer 600 and goes toward the observer 10000.

On this occasion, light incident onto the color filter unit 900 behaves as follows. When, for example, light is incident onto a color filter 900R capable of transmitting red light, red light is transmitted through the color filter 900R but light at wavelengths in the visible region excluding the wavelength range for the red light is absorbed to the color filter 900R. For this reason, external light incident onto the display device is absorbed not only to the polarizer but also to the color filter unit. Hence, reflection of external light is reduced so that black display becomes darker. Hence, high-contrast-ratio image display can be achieved even under a bright environment.

In Embodiment 1, in order to reduce reflection of external light, the display device is formed so that wavelength ranges of main reflection by cholesteric liquid-crystal layers constituting the polarized light separating unit 500 do not overlap one another. In this embodiment, since an external light reflection lowering effect is obtained by arrangement of color filters, the wavelength ranges of-selective reflection by the cholesteric liquid-crystal layers constituting the polarized light separating unit 500 may be widened so that the wavelength ranges of main reflection by the cholesteric liquid-crystal layers overlap one another.

In this case, particularly when the wavelength ranges of selective reflection by the cholesteric liquid-crystal layers are widened so that substantially-uniform selective reflection can be obtained at all wavelengths in the visible region, there is obtained an effect that the color change caused by angle dependence of selective reflection by the cholesteric liquid-crystal layers in oblique observation can be suppressed.

Figure 15:
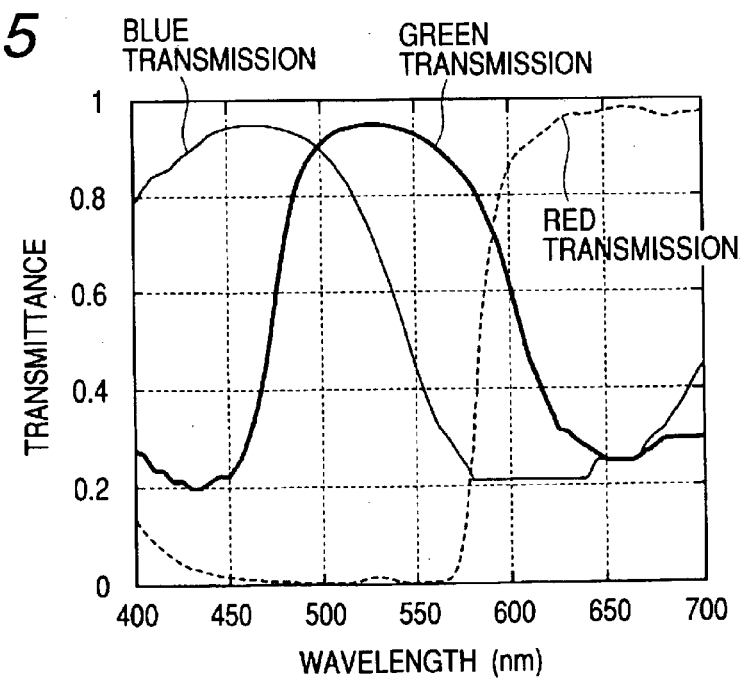
FIG. 15 is a graph showing an example of optical characteristic of color filters in the display device according to the invention.

Incidentally, as characteristic of color filters, the color filters each having light transmittance of not lower than 95% with respect to a desired color are preferably used from the point of view of improving display luminance. FIG. 15 is a graph showing an example of transmission characteristic of the color filters.

In this case, since transmittance with respect to a wavelength required to be absorbed generally increases, the color of each color filter becomes pale. In the display device according to this embodiment, there is little influence on image quality such as chromaticity because light itself emitted from the light-emitting layer is light in a predetermined wavelength range. In addition, external light incident onto the display device is absorbed sufficiently because the external light passes through the color filter twice in the outward route to the reflection electrode and in the homeward route after reflection by the reflection electrode. Hence, reflection of external light can be suppressed.

Incidentally, in this embodiment, each color filter is disposed between the polarized light separating unit and the polarizer. This is because light emitted from the organic layer and reflected by the polarized light separating unit to be reused is prevented from being absorbed to the color filter so that reduction in the luminance improving effect can be avoided. That is, if each color filter is disposed between the polarized light separating unit and the reflection electrode, luminance is lowered by absorption of light to the color filter because light which is a part of light emitted from the organic layer and which is reflected by the polarized light separating unit and the reflection electrode so as to become incident onto the polarized light separating unit again passes through the color filter by twice.

When each color filter is disposed between the polarized light separating unit and the reflection electrode, there is however an effect that the contrast ratio can be improved under a bright environment because reflection of external light incident onto the display device is reduced compared with the case where the color filter is disposed between the polarized light separating unit and the polarizer.

When each color filter is disposed between the polarized light separating unit and the reflection electrode, at least a half part of external light incident onto the display device is first absorbed to the polarizer. The other part of light transmitted through the polarizer is further transmitted through the retarder, the polarized light separating unit and the color filter and then reflected by the reflection electrode. The light reflected by the reflection electrode is passed through the color filter so as to be incident onto the polarized light separating unit. Of the light incident onto the polarized light separating unit, light at wavelengths out of the wavelength range of selective reflection by each of the cholesteric liquid-crystal layers constituting the polarized light separating unit does not go out because the light is absorbed to the polarizer by the action of the retarder when the light is transmitted through the polarized light separating unit and passes through the retarder.

On the other hand, light in the wavelength range of selective reflection by each of the cholesteric liquid-crystal layers constituting the polarized light separating unit is reflected by the polarized light separating unit. After the light passes through the color filter, the light is reflected by the reflection electrode again and passes through the color filter again. The light passes through the polarized light separating unit, the retarder and the polarizer and goes out of the display device. The light going out of the display device is equivalent to reflection of external light. Because the light passes through the color filter by four times in total, the intensity of the light becomes slight by absorption of light to the color filter. Hence, the contrast ratio can be improved under a bright environment.

Incidentally, a black matrix of a photosensitive resin containing metallic chromium, chromium oxide or a light-absorbing pigment dispersed therein may be formed between the color filters into which the color filter unit is divided. In this case, the size of each opening portion in the black matrix is preferably selected to be larger than the size of each pixel so that a large margin can be kept for alignment of the color filters with the pixels.

(Embodiment 3)

Figure 16:
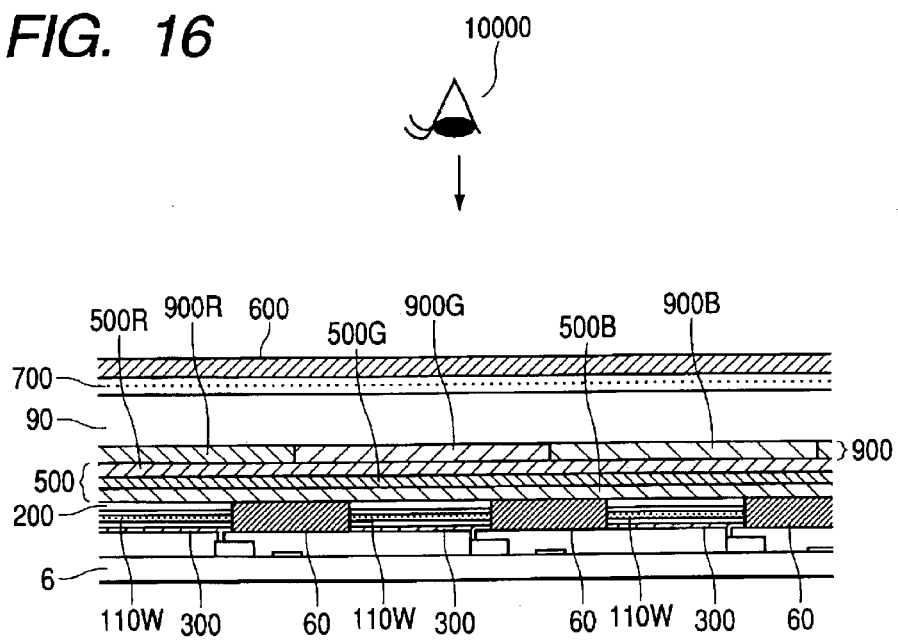
FIG. 16 is a partly schematic sectional view showing an example of the display device according to the invention.

FIG. 16 is a partly sectional view schematically showing a display device according to this embodiment. The basic configuration of the display device is the same as that of the display device according to Embodiment 2 except that the color of light emitted from the organic layer is white. Like numerals refer to like parts for the sake of omission of duplicated description.

As shown in FIG. 16, the display device according to this embodiment is configured in the same manner as in Embodiment 2 described with reference to FIG. 14, except that all red light-emitting, green light-emitting and blue light-emitting organic layers into which the organic layer is divided are replaced by white light-emitting organic layers 110W.

The organic layer for achieving white light emission may be constituted by a laminate of a plurality of light-emitting layers different in emitted light color or may be constituted by a light-emitting layer doped with dyes different in emitted light color.

As an example of the former configuration, there may be used TPD and Alq3 having Alq3 partially doped with Nile red and combined with 1,2,4-triazole derivative (TAZ). As an example of the latter configuration, there may be used PVK doped with three kinds of dyes, e.g., 1,1,4,4-tetraphenyl-1,3-butadiene (TPB), coumarin-6, and DCM-1. In any case, an organic layer which is high in light-emitting efficiency and long in life and by which white light emission can be obtained is preferably used as the white light-emitting organic layer.

Figure 17:
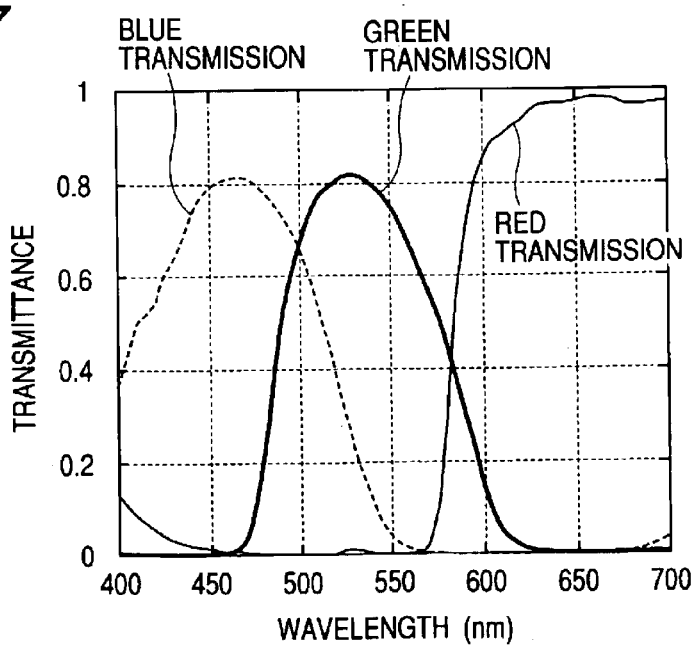
FIG. 17 is a graph showing an example of optical characteristic of color filters in the display device according to the invention.

FIG. 17 is a graph showing an example of transmission characteristic of a color filter unit used in this embodiment.

In this embodiment, it is necessary to use the color filter unit for converting white light into the three primary colors of red, green and light. From the point of view of achieving a wide color reproduction range, it is therefore important to use color filters each capable of transmitting light at desired wavelengths but reducing transmission of light at the other wavelengths in the visible region as much as possible, as shown in FIG. 17.

The color filter unit is constituted by three kinds of color filters 900R, 900G and 900B. The color filter 900R transmitting red light is located to cover the organic layers 110W contained in red display pixels respectively. The color filter 900G transmitting green light is located to cover the organic layers 110W contained in green display pixels respectively. The color filter 900B transmitting blue light is located to cover the organic layers 110W contained in blue display pixels respectively.

The operation of the display device will be described below. The light-emitting operation of the display device is the same as that of the display device according to the previous embodiment. In synchronism with application of a turn-on voltage to a gate line corresponding to a pixel in which the amount of emitted light will be controlled, a voltage corresponding to image information is applied through a data line to thereby control the amount of light emitted from the pixel. The amounts of light emitted from a plurality of pixels constituting the display portion are controlled in accordance with image information to thereby display a desired image.

Light emitted from each organic layer 110W is incident onto the polarized light separating unit 500 directly or after reflected by the reflection electrode 300. The polarized light separating unit is constituted by a laminate of cholesteric liquid-crystal layers having wavelength ranges of selective reflection of light with colors to be displayed by the pixels respectively. Hence, of the light emitted from an organic layer 110W in a red color display pixel so as to be incident onto the polarized light separating unit 500, a circularly polarized light component rotating in one direction (e.g., left-hand circularly polarized light component) is selectively reflected by a corresponding one of the cholesteric liquid-crystal layers constituting the polarized light separating unit 500 but the other light component is transmitted through the polarized light separating unit 500.

The light transmitted through the polarized light separating unit 500 is incident onto the red color filter 900R capable of transmitting red light. A large part of the light at wavelengths out of the predetermined wavelength range corresponding to red is absorbed to the red color filter 900R on the other hand, light in the predetermined wavelength range corresponding to red is transmitted through the red color filter 900R and converted from circularly polarized light into linearly polarized light by the action of the retarder 700. The linearly polarized light is transmitted through the polarizer 600 without being desorbed to the polarizer 60 to thereby go toward the observer 10000.

On the other hand, the light reflected by the polarized light separating unit 500 is further reflected by the reflection electrode 300 and goes toward the polarized light separating unit 500 again. At this time, the light is transmitted through the polarized light separating unit 500 because the phase of the light shifts by n to convert the light into circularly polarized light rotating in the reverse direction (e.g., right-hand circularly polarized light) when the light is reflected by the reflection electrode 300. The light transmitted through the polarized light separating unit 500 is further transmitted through the red color filter 900R and converted into linearly polarized light by the action of the retarder 700 so that the linearly polarized light can be transmitted through the polarizer 600. Then, the linearly polarized light is transmitted through the polarizer 600 and goes toward the observer 10000.

That is, of the white light emitted from an organic layer 110W corresponding to a red display pixel, only light in a predetermined wavelength range corresponding to red goes toward the observer 10000 without being absorbed to the color filter 900R and the polarizer 600. Hence, bright red light can be obtained.

Of the white light emitted from an organic layer 110W corresponding to a green (or blue) display pixel, only light in the predetermined wavelength range corresponding to green (or blue) goes toward the observer 10000 without being absorbed to the color filter 900G (or color filter 900B) and the polarizer 600, in the same manner as described above. Hence, bright green light (or blue light) can be obtained.

Also in this embodiment, like the previous embodiment, wasteful light absorbed to the polarizer in the related art can be utilized effectively to improve luminance. Hence, there is an effect that bright display can be obtained.

On the other hand, at least a half part of external light incident onto the display device is absorbed to the polarizer 600 when the external light passes through the polarizer 600. The light transmitted through the polarizer 600 is further transmitted through the color filter unit 900, the polarized light separating unit 500, etc. and reflected by the reflection electrode 300 so as to be incident onto the polarized light separating unit 500. Of the light incident onto the polarized light separating unit 500, light at wavelengths out of the wavelength range of selective reflection by a corresponding one of the cholesteric liquid-crystal layers constituting the polarized light separating unit 500 does not go out of the display device because the light is absorbed to the polarizer 600 by the action of the retarder 700 when the light is transmitted through the polarized light separating unit 500 and passes through the retarder 700.

On the other hand, light in the wavelength range of selective reflection by a corresponding one of the cholesteric liquid-crystal layers constituting the polarized light separating unit 500 is reflected by the polarized light separating unit 500 and further reflected by the reflection electrode 300 again. At this time, the light is transmitted through the polarized light separating unit 500, and further transmitted through the color filter unit 900, the retarder 700 and the polarizer 600, and goes toward the observer 10000.

This light is equivalent to reflection of external light. The intensity of this light is slight because a large part of the light is absorbed to the color filter unit when the light passes through the color filter unit twice. That is, reflection of external light incident onto the display device under a bright environment is reduced by absorption of the light to the color filter unit, so that black display becomes darker. Hence, high-contrast-ratio image display can be achieved even under a bright environment.

Incidentally, also in this embodiment, the wavelength ranges of selective reflection by the cholesteric liquid-crystal layers constituting the polarized light separating unit 500 may be widened to obtain substantially uniform selective reflection at all wavelengths in the visible region to thereby attain suppression of color change caused by angle dependence of selective reflection by the cholesteric liquid-crystal layers in oblique observation.

The wavelength ranges of selective reflection by the cholesteric liquid-crystal layers constituting the polarized light separating unit may be contrariwise narrowed so that the wavelength distribution of light emitted from the display device can be made more precipitous to improve color purity. In this case, the display device can be provided as a display device high in contrast ratio and color purity and having a wide display color range compared with a color display device in the related art formed in such a manner that organic light-emitting diodes for emitting white light are combined with color filters.

(Embodiment 4)

Figure 18:
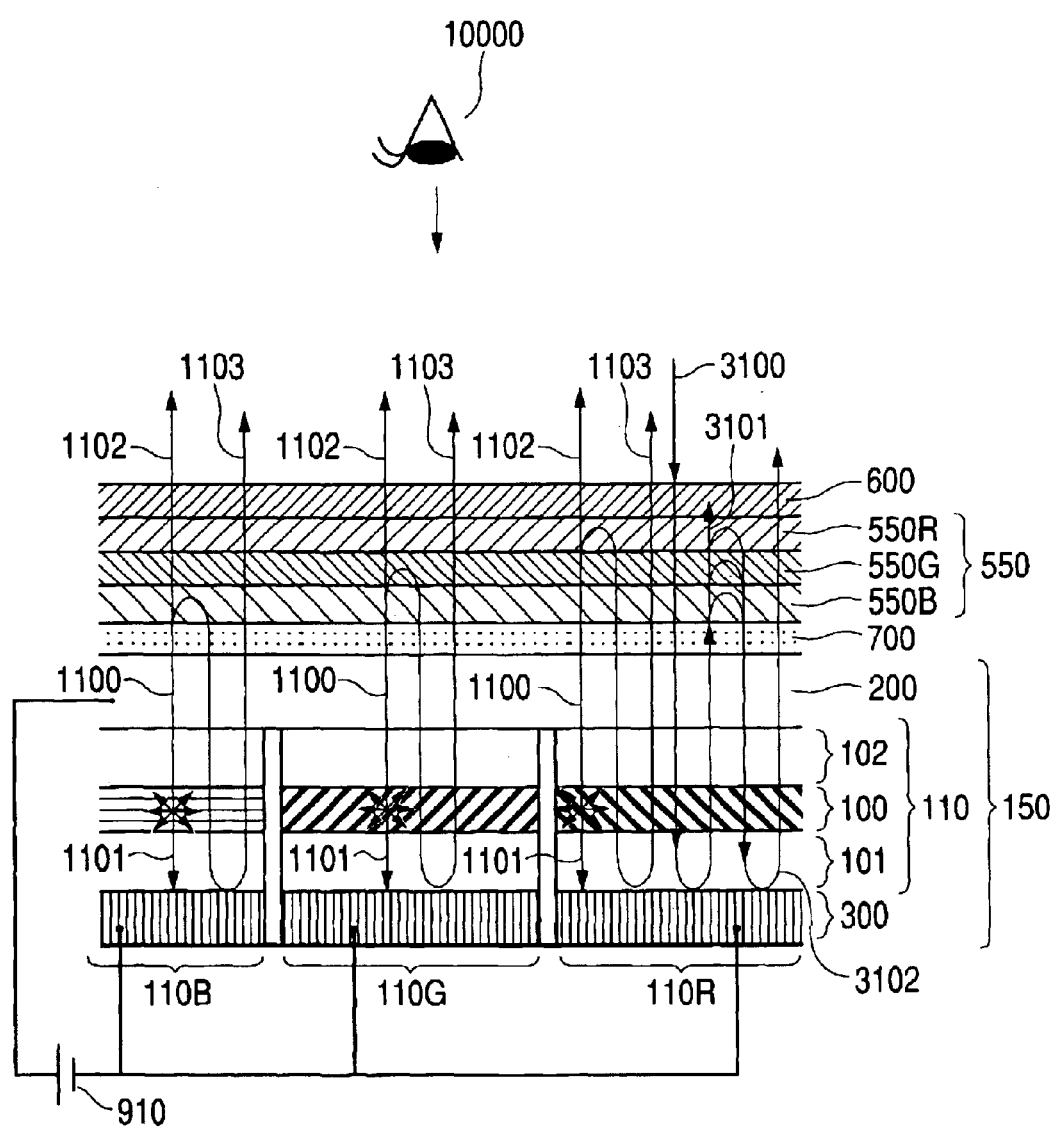
FIG. 18 is a partly schematic sectional view showing an example of the display device according to the invention) and FIG. 19 is a partly schematic sectional view showing a display device according to the related art.
Figure 19:
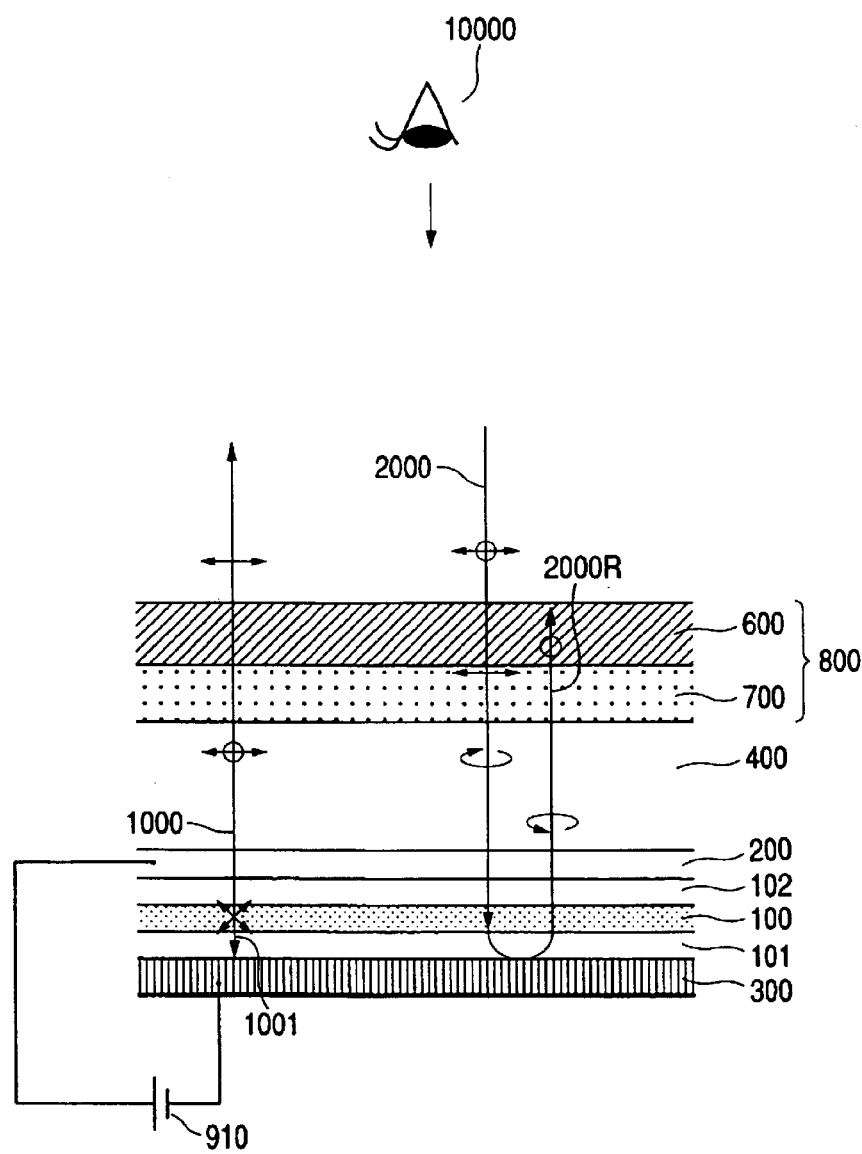

FIG. 18 is a partly schematic sectional view for explaining the basic configuration and operating principle of a display device according to this embodiment. In the display device according this embodiment, a polarized light separating unit (hereinafter referred to as "linearly polarized light separating unit") 550 capable of reflecting a linearly polarized light component in a predetermined wavelength range but transmitting the other light component is used in place of the polarized light separating unit constituted by the cholesteric liquid-crystal layers in the previous embodiments. Therefore, parts common to those in the previous embodiments are referred to by the same numerals as those in the previous embodiments for the sake of omission of duplicated description.

As shown in FIG. 18, the display device in the embodiment includes an organic light-emitting diode section 150, a retarder 700, a linearly polarized light separating unit 550, and a polarizer 600. The organic light-emitting diode section 150 has a transparent electrode 200 formed on a substrate not shown, a reflection electrode 300 shaped like a mirror surface and having a light-reflecting function, and an organic layer 110 formed between the transparent electrode 200 and the reflection electrode 300. The retarder 700, the linearly polarized light separating unit 550 and the polarizer 600 are laminated and disposed on the transparent electrode 200 of the organic light-emitting diode section 150 successively.

The linearly polarized light separating unit 550 has a function for reflecting a linearly polarized light component in a predetermined wavelength range out of the incident light onto the linearly polarized light separating unit 550 but transmitting the other linearly polarized light component having a plane of polarization perpendicular to that of the first-mentioned linearly polarized light component. Various configurations may be conceived as the configuration of the linearly polarized light separating unit 550. For example, there may be used a birefringence reflective polarizing film constituted by an alternate laminate of different birefringent high-molecular films as described in International Patent Publication No.: WO95/27919 or a polarized light separating surface of a multilayer film formed on a joint portion of two prism array sheets each having a vertical angle of about 90 degrees as described in SID92 Digest p.427.

The linearly polarized light separating unit 550 is, constituted by linearly polarized light reflecting layers which have reflection wavelength ranges substantially coincident with the wavelength range of light emitted from the organic layer 110 and which are of the number corresponding to the number of colors of light emitted from the organic layer 110. That is, when the organic layer 110 is divided into a red light-emitting organic layer 110R, a green-emitting organic layer 110G and a blue light-emitting organic layers by three colors, the linearly polarized light separating unit 550 is constituted by a laminate of the three layers consisting of a linearly polarized light reflecting layer 550R for reflecting red light, a linearly polarized light reflecting layer 550G for reflecting green light, and a linearly polarized light reflecting layer 550B for reflecting blue light.

Materials for forming a so-called circularly polarizing plate in the related art may be used for the retarder 700 and the polarizer 600. That is, of the light passing through the polarizer 600, the polarizer 600 transmits linearly polarized light having a plane of polarization in a specific direction but absorbs linearly polarized light having a plane of polarization perpendicular to the specific direction. The retarder 700 functions as a quarter-wave plate for converting the linearly polarized light into circularly polarized light having a rotating plane of polarization.

The linearly polarized light separating unit 550 is disposed between the polarizer 600 and the retarder 700 constituting the circularly polarizing plate. On this occasion, the linearly polarized light separating unit 550 is disposed so that an axis of transmission of linearly polarized light in the linearly polarized light separating unit 550 coincides with an axis of transmission of linearly polarized light in the polarizer 600.

The operation of the display device will be described below with reference to FIG. 18. A DC power supply 910 is connected between the transparent electrode 200 and each reflection electrode 300. When a DC voltage is applied between the transparent electrode 200 and the reflection electrode 300, light at a predetermined wavelength is emitted from the light-emitting layer 100. Of the light emitted from the light-emitting layer 100, light 1100 going toward the transparent electrode 200 side is directly transmitted through the transparent electrode 200 and the retarder 700 so as to be incident onto the linearly polarized light separating unit 550.

On the other hand, of the light emitted front the light-emitting layer 100, light 1101 going toward the reflection electrode 300 side is reflected by the reflection electrode 300, and also transmitted through the transparent electrode 200 and the retarder 700 so as to be also incident onto the-linearly polarized light separating unit 550. On this occasion, because the light emitted from the light-emitting layer 100 and made incident onto the linearly polarized light separating unit 550 is non-polarized light, a linearly polarized light component to be absorbed to the polarizer 600 is reflected by the linearly polarized light separating unit 550 whereas a linearly polarized light component to be transmitted through the polarizer 600 is transmitted through the linearly polarized light separating unit 550. The light 1102 transmitted through the linearly polarized light separating unit 550 is further transmitted through the polarizer 600 and goes toward the observer 10000.

On the other hand, the light 1103 reflected by the linearly polarized light separating unit 550 is transmitted through the retarder 700 and goes toward the reflection electrode 300. When the light passes through the retarder 700, the light 1103 is, however, converted into circularly polarized light having a rotating plane of polarization by the action of the retarder 700. When the light 1103 going toward the reflection electrode 300 is reflected by the reflection electrode 300, the phase of the light 1103 shifts by n to convert the light 1103 into circularly polarized light rotating in the reverse direction. In this case, when the circularly polarized light passes through the retarder 700 again, the circularly polarized light is converted into linearly polarized light by the action of the retarder 700 this time, so that the linearly polarized light can be transmitted through the linearly polarized light separating unit 550. Hence, the linearly polarized light is then transmitted through the linearly polarized light separating unit 550 and the polarizer 600 and goes toward the observer 10000.

That is, also in the display device according to this embodiment, of light emitted from the light-emitting layer 100, light absorbed to the polarizer as a light loss in the related art can be reused efficiently. Hence, the amount of light going toward the observer 10000 increases, so that luminance is improved.

External light incident onto the display device under a bright environment will be described below. External light 3100 incident onto the display device from the environment is generally non-polarized light. When the external light passes through the polarizer 600, a linearly polarized light component having a plane of polarization in a specific direction is absorbed to the polarizer 600 but only a linearly polarized light component having a plane of polarization perpendicular to the specific direction is transmitted through the polarizer 600. The linearly polarized light component transmitted through the polarizer 600 is further transmitted through the linearly polarized light separating unit 550 and converted into circularly polarized light having a rotating plane of polarization by the action of the retarder 700. When the light transmitted through the retarder 700 is reflected by the reflection electrode 300, the phase of the light shifts by n to convert the light into circularly polarized light rotating in the reverse direction.

When the light reflected by the reflection electrode 300 passes through the retarder 700 again, the light is converted into linearly polarized light this time so that the linearly polarized light can be absorbed to the polarizer 600. After the conversion, the linearly polarized light is incident onto the linearly polarized light separating unit 550. The linearly polarized light separating unit 550 reflects light in a wavelength range corresponding to the wavelength range of light emitted from the light-emitting layer but transmits light at wavelengths out of the wavelength range. The light 3101 transmitted through the linearly polarized light separating unit 550 is absorbed to the polarizer 600 so as not to return back to the outside of the display device.

On the other hand, when the light 3102 passes through the retarder 700, the light 3102 reflected by the linearly polarized light separating unit 550 is converted into circularly polarized light by the action of the retarder 700. When the light 3102 is reflected by the reflection electrode 300 again, the phase of the light shifts by n to convert the light 3102 into circularly polarized light rotating in the reverse direction. When the light reflected by the reflection electrode 300 again passes through the retarder 700, the light is converted into linearly polarized light this time so that the linearly polarized light can be transmitted through the polarizer 600. Hence, the light is then transmitted through the linearly polarized light separating unit 550 and the polarizer 600 and goes toward the observer 10000.

That is, at least a half part of external light 3100 incident onto the display device is first absorbed to the polarizer 600. The light transmitted through the polarizer 600 is further transmitted through the linearly polarized light separating unit 550, the retarder 700, etc. and reflected by the reflection electrode 300 so as to be incident onto the linearly polarized light separating unit 550 again. Of the incident light, light 3101 transmitted through the linearly polarized light separating unit 550 is absorbed to the polarizer 600. Hence, the light which can go out of the display device is only light 3102 which is reflected in the wavelength range by the linearly polarized light separating unit 550 with a small amount.

That is, also in the display device according to this embodiment, like the previous embodiments, a large amount of external light is cut-off even under a bright environment. Hence, black display becomes so darker that high-contrast-ratio display can be achieved.

In addition, the wavelength range of reflection of linearly polarized light by the linearly polarized light separating unit 550 can be selected to be narrower than the wavelength range of light emitted from the light-emitting layer. Hence, there is an effect that color purity of light going toward the observer 10000 can be improved or the contrast ratio can be improved more greatly under a bright environment.

In the display device according to the invention, light absorbed to the polarizer as a light loss in the related art can be reused efficiently by the action of the polarized light separating unit constituted by cholesteric liquid-crystal layers, so that the amount of light going toward the observer increases. Hence, a display device higher in luminance and brighter can be provided when consumed electric power is kept the same as in the related art.

Moreover, the current flowing in each light-emitting element can be made smaller when luminance is kept the same as in the related art. Hence, a display device long in time can be provided.

Moreover, the wavelength range of light reflected by the polarized light separating unit to be reused can be controlled to obtain light with higher color purity than that of light itself emitted from the light-emitting layer itself. Hence, a display device having a wide color reproduction range can be achieved.

In addition, a large part of reflection of external light can be cut off so that black display becomes darker. Hence, a high-contrast-ratio display device can be achieved even under a bright environment.

What is claimed is:

1. A display device comprising:
    a light-emitting element for constituting pixels arranged in a matrix structure, the light-emitting element including
    a light-emitting layer,
    a light-reflecting surface disposed on a back surface of said light-emitting layer,
    a light polarization separating unit for separating light emitted from said light-emitting layer into two kinds of polarized light components by reflection and transmission;
    a retarder, and
    a polarizer;
    wherein said light polarization separating unit, said retarder and said polarizer are provided on a front surface side of said light-emitting layer; and
    said light polarization separating unit comprises a plurality of light polarization separating layers disposed on top of each other as separate layers of the light-emitting element and through which light in a wavelength range corresponding to light emitted from said light-emitting layer is separated into two kinds of polarized light components by reflection and transmission, said light polarization separating layers being laminated in a predetermined number corresponding to the number of colors of light emitted from said light-emitting layer.

2. A display device according to claim 1, wherein said light polarization separating layers are formed so that wavelength ranges of main reflection by said light polarization separating layers do not overlap one another.

3. A display device according to claim 1, wherein:
    said light-emitting layer is configured to substantially retain a state of polarization of light transmitted through said light-emitting layer; and
    said light-reflecting surface is a reflecting surface reflecting at least perpendicularly incident circularly polarized light rotating in one direction to thereby make said circularly polarized light rotate in a reverse direction to said one direction.

4. A display device according to claim 3, wherein said light-emitting element is an organic light-emitting diode, said a light-reflecting surface is a reflection electrode, and said light-emitting layer is an organic thin film.

5. A display device according to claim 1, wherein said light-emitting layer constituting said pixels is divided into red, green and blue light-emitting layers for performing color display; and a red light transmission color filter, a green light transmission color filter and a blue transmission color filter are provided on front surface sides of said red, green and blue light-emitting layers respectively.

6. A display device according to claim 5, wherein said color filters are disposed on a front surface side of said display device with respect to said light polarization separating unit.

7. A display device according to claim 5, wherein said color filters have light transmittances of not lower than 95% with respect to desired colors.

8. A display device according to claim 1, wherein:

said light-emitting layer constituting said pixels is a white light-emitting layer; and color filters transmitting predetermined colors are provided on a front surface side of said light-emitting layer.

9. A display device according to claim 1, wherein:

said light polarization separating layers are cholesteric liquid-crystal layers;

said retarder is a quarter-wave plate; and said light polarization separating unit, said retarder and said polarizer are disposed in order viewed from said light-emitting layer side.

10. A display device according to claim 1, wherein:

said light polarization separating unit is configured to reflect a linearly polarized light component in a predetermined wavelength range and to transmit a linearly polarized light component which is not in the predetermined wavelength range;

said retarder is a quarter-wave plate; and said retarder, said light polarization separating unit and said polarizer are disposed in order viewed from said light-emitting layer side.

11. A display device according to claim 1, wherein wavelength ranges of main reflection by said light polarization separating layers partially overlap one another.

* * * * *